US012002713B2

United States Patent
Hotta

(10) Patent No.: US 12,002,713 B2
(45) Date of Patent: Jun. 4, 2024

(54) METHOD FOR MANUFACTURING STRUCTURE

(71) Applicant: FUJIFILM Corporation, Tokyo (JP)

(72) Inventor: Yoshinori Hotta, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 324 days.

(21) Appl. No.: 17/668,949

(22) Filed: Feb. 10, 2022

(65) Prior Publication Data
US 2022/0165619 A1 May 26, 2022

Related U.S. Application Data

(63) Continuation of application No. PCT/JP2020/027662, filed on Jul. 16, 2020.

(30) Foreign Application Priority Data

Aug. 16, 2019 (JP) ................................. 2019-149321

(51) Int. Cl.
H01L 21/00 (2006.01)
H01L 21/768 (2006.01)

(52) U.S. Cl.
CPC .. H01L 21/76877 (2013.01); H01L 21/76816 (2013.01)

(58) Field of Classification Search
CPC ......... H01L 21/76877; H01L 21/76816; C23C 18/1644
See application file for complete search history.

(56) References Cited

U.S. PATENT DOCUMENTS 9,899,306 B2 * 2/2018 Hotta ..................... H05K 3/323
10,249,563 B2 * 4/2019 Kurooka .................. H05K 1/14
(Continued)

FOREIGN PATENT DOCUMENTS

CN 113209833 A * 8/2021 ......... B01D 67/0079
CN 113209833 B * 3/2022 ......... B01D 67/0079
(Continued)

OTHER PUBLICATIONS

Taibi et al., "Full Characterization of Cu/Cu Direct Bonding for 3D Integration", 2010 Proceedings, 60th Electronic Components and Technology Conference, 2010, pp. 219-225 (8 pages total).
(Continued)

*Primary Examiner* — Laura M Menz
(74) *Attorney, Agent, or Firm* — Sughrue Mion, PLLC

(57) ABSTRACT

Provided is a method of manufacturing a structure that can be easily bonded to a bonding target. The method of manufacturing a structure includes: a conductive layer forming step of forming a conductive layer having conductivity on a part of a surface of an insulating support including at least one surface; a valve metal layer forming step of forming a valve metal layer that covers at least a part of the conductive layer; an anodic oxidation film forming step of forming an anodic oxidation film by performing an anodization treatment on the valve metal layer in a region on the conductive layer using the conductive layer as an electrode; a micropore forming step of forming a plurality of micropores that extend in a thickness direction on the anodic oxidation film; and a filling step of filling the micropores with a conductive material, in which a valve metal layer removing step of removing the valve metal layer having undergone the anodic oxidation film forming step is performed between the anodic oxidation film forming step and the filling step.

20 Claims, 13 Drawing Sheets

(56) References Cited

U.S. PATENT DOCUMENTS

| | | | |
|---|---|---|---|
| 11,011,499 B2 * | 5/2021 | Hotta | H01L 24/32 |
| 2005/0068413 A1 * | 3/2005 | Hotta | B41N 3/038 |
| | | | 347/264 |
| 2011/0267825 A1 * | 11/2011 | Hotta | C25F 3/04 |
| | | | 205/172 |
| 2012/0091495 A1 * | 4/2012 | Hatanaka | H01L 33/60 |
| | | | 205/112 |
| 2016/0153104 A1 * | 6/2016 | Yamashita | C25D 1/10 |
| | | | 205/78 |
| 2017/0125330 A1 * | 5/2017 | Hotta | H05K 1/03 |
| 2017/0330828 A1 * | 11/2017 | Kurooka | H01L 23/49894 |
| 2019/0363068 A1 * | 11/2019 | Hotta | H01L 24/80 |
| 2020/0009845 A1 * | 1/2020 | Ogawa | H01L 21/6835 |
| 2020/0168551 A1 | 5/2020 | Yamashita | |
| 2021/0363653 A1 * | 11/2021 | Hotta | C25D 11/20 |
| 2022/0165619 A1 * | 5/2022 | Hotta | C25D 11/08 |

FOREIGN PATENT DOCUMENTS

| | | | | |
|---|---|---|---|---|
| CN | 114207793 A | * | 3/2022 | H01L 21/76816 |
| CN | 115003864 A | * | 9/2022 | |
| CN | 116666346 A | * | 8/2023 | |
| CN | 116670337 A | * | 8/2023 | |
| CN | 116710599 A | * | 9/2023 | |
| CN | 116783331 A | * | 9/2023 | |
| CN | 116830391 A | * | 9/2023 | |
| CN | 116917553 A | * | 10/2023 | |
| JP | 2001-143600 A | | 5/2001 | |
| JP | 2004-014406 A | | 1/2004 | |
| JP | 2006-326724 A | | 12/2006 | |
| JP | 2012201915 A | * | 10/2012 | |
| JP | 2019147988 A | | 9/2019 | |
| JP | 2019149448 A | | 9/2019 | |
| JP | 7220796 B2 | * | 2/2023 | H01L 21/76816 |
| JP | 7357142 B2 | * | 10/2023 | |
| WO | 2015/029881 A1 | | 3/2015 | |
| WO | WO-2017094874 A1 | * | 6/2017 | B23K 20/00 |
| WO | WO-2017203884 A1 | * | 11/2017 | H01L 21/187 |
| WO | WO-2018155273 A1 | * | 8/2018 | C25D 11/04 |
| WO | 2018/159186 A1 | | 9/2018 | |
| WO | 2019/039071 A1 | | 2/2019 | |
| WO | WO-2020166240 A1 | * | 8/2020 | C25D 11/12 |
| WO | WO-2021033466 A1 | * | 2/2021 | H01L 24/03 |
| WO | WO-2021033467 A1 | * | 2/2021 | H01L 21/76816 |
| WO | WO-2021153112 A1 | * | 8/2021 | |
| WO | WO-2021171808 A1 | * | 9/2021 | |
| WO | WO-2021176847 A1 | * | 9/2021 | |
| WO | WO-2021177013 A1 | * | 9/2021 | |
| WO | WO-2021261122 A1 | * | 12/2021 | |
| WO | WO-2022009685 A1 | * | 1/2022 | |
| WO | WO-2022014293 A1 | * | 1/2022 | |
| WO | WO-2022034769 A1 | * | 2/2022 | |
| WO | WO-2022044585 A1 | * | 3/2022 | |
| WO | WO-2022138151 A1 | * | 6/2022 | |
| WO | WO-2022138219 A1 | * | 6/2022 | |
| WO | WO-2022158277 A1 | * | 7/2022 | |
| WO | WO-2022163260 A1 | * | 8/2022 | |
| WO | WO-2022181300 A1 | * | 9/2022 | |

OTHER PUBLICATIONS

International Search Report dated Sep. 29, 2020 from the International Searching Authority in International Application No. PCT/JP2020/027662.

Written Opinion dated Sep. 29, 2020 from the International Searching Authority in International Application No. PCT/JP2020/027662.

International Preliminary Report on Patentability with the translation of Written Opinion dated Feb. 17, 2022 from the International Bureau in International Application No. PCT/JP2020/027662.

* cited by examiner

METHOD FOR MANUFACTURING STRUCTURE

CROSS-REFERENCE TO RELATED APPLICATIONS

This application is a Continuation of PCT International Application No. PCT/JP2020/027662 filed on Jul. 16, 2020, which claims priority under 35 U.S.C. § 119(a) to Japanese Patent Application No. 2019-149321 filed on Aug. 16, 2019. The above application is hereby expressly incorporated by reference, in its entirety, into the present application.

BACKGROUND OF THE INVENTION

1. Field of the Invention

The present invention relates to a method of manufacturing a structure for bonding to an object, and particularly relates to a method of manufacturing a structure in which an anodic oxidation film is formed by anodizing a valve metal layer using a conductive layer and micropores that extend in a thickness direction of the anodic oxidation film are filled with a conductive material.

2. Description of the Related Art

Currently, various methods for electrical connection between electronic components such as a semiconductor element and electrical connection between an electronic component and a circuit board are used.

The downsizing of an electronic component such as a semiconductor element has been remarkable. In a method of directly connecting a wiring board, for example, wire bonding in the related art, flip chip bonding, thermocompression bonding, and the like, stability of electrical connection to an electronic component cannot be sufficiently secured. Therefore, for the electrical connection to an electronic component, for example, underfilling for adhesiveness with a Cu/Sn bump is used. However, depending on electronic components or circuit boards such as connection targets, local stress is induced by mismatch in coefficient of thermal expansion (CTE) such that the reliability of electrical connection deteriorates.

In addition, a connection density of several tens of millions per die is required for a semiconductor element. In order to deal with this request, the size of a bump needs to be reduced up to a diameter of about 1 to 2 µm. However, regarding a Cu/Sn bump formed by current electroplating, it is difficult to reduce the size up to 5 µm or less.

For the reliability of the electrical connection and the required connection density, disclosed is a bonding method that is so-called hybrid bonding in which a bonding surface of a wafer forming a semiconductor element, a semiconductor element, or the like that is a connection target is mirror-surfaced by chemical mechanical polishing (CMP) for bonding (for example, refer to R. Taibi, et al., "Full characterization of Cu/Cu direct bonding for 3D integration", Electronic Components and Technology Conference (ECTC), 2010 Proceedings 60th, 2010, p. 219-225).

SUMMARY OF THE INVENTION

In the bonding method called hybrid bonding described in R. Taibi, et al., "Full characterization of Cu/Cu direct bonding for 3D integration", Electronic Components and Technology Conference (ECTC), 2010 Proceedings 60th, 2010, p. 219-225, it is necessary to mirror-surface the bonding surface of a wafer, a semiconductor element, or the like by chemical mechanical polishing (CMP). In a case where the bonding surface is mirror-surfaced by CMP, Cu for electrical connection or Si as an insulator is exposed, and it is necessary to accurately control the flatness of the bonding surface such that unevenness such as dishing is not formed on the bonding surface. As a result, there is a problem in that the bonding step is complicated.

Further, in the hybrid bonding, in order to secure electrical connection in a bonding portion, it is necessary that an environment during bonding is strictly controlled to suppress contamination such as entrance of particles or the like between bonding surfaces during bonding, and thus there is a problem in that the bonding step is complicated. In a case where the control of the environment during bonding is neglected, the bonding surface is contaminated, the area of a portion electrical connection cannot be secured after bonding increases, the yield rapidly decreases, and bonding that satisfies the specification is difficult. Therefore, in the hybrid bonding, it is difficult to simplify the bonding step.

The present invention is made in consideration of the problems based on the related art, and an object thereof is to provide a method of manufacturing a structure that can be easily bonded to a bonding target.

In order to achieve the above-described object, according to the present invention, there is provided a method of manufacturing a structure comprising: a conductive layer forming step of forming a conductive layer having conductivity on a part of a surface of an insulating support including at least one surface; a valve metal layer forming step of forming a valve metal layer that covers at least a part of the conductive layer; an anodic oxidation film forming step of forming an anodic oxidation film by performing an anodization treatment on the valve metal layer in a region on the conductive layer using the conductive layer as an electrode; a micropore forming step of forming a plurality of micropores that extend in a thickness direction on the anodic oxidation film; and a filling step of filling the micropores with a conductive material, in which a valve metal layer removing step of removing the valve metal layer having undergone the anodic oxidation film forming step is performed between the anodic oxidation film forming step and the filling step.

It is preferable that the valve metal layer removing step is performed between the anodic oxidation film forming step and the micropore forming step or between the micropore forming step and the filling step.

It is preferable that the micropore forming step includes a step of exposing the conductive layer by forming the plurality of micropores through the anodic oxidation film in the thickness direction.

It is preferable that, in the valve metal layer forming step, the valve metal layer is formed at a temperature of the insulating support of 60° C. or lower.

It is preferable that the method of manufacturing a structure further includes a protrusion step of causing a plurality of conductive paths formed of the filled conductive material to protrude from the anodic oxidation film.

It is preferable that each of the plurality of conductive paths that protrude in the protrusion step has the same height as a protrusion portion that protrudes from the anodic oxidation film.

It is preferable that the conductive layer is formed of the same material as the conductive material.

It is preferable that the valve metal is aluminum.

It is preferable that the surface of the insulating support includes an element region, and it is preferable that, in the conductive layer forming step, the conductive layer is formed on the element region of the surface of the insulating support.

According to the present invention, a structure that can easily bonded to a bonding target can be obtained.

DESCRIPTION OF THE PREFERRED EMBODIMENTS

Figure 1:
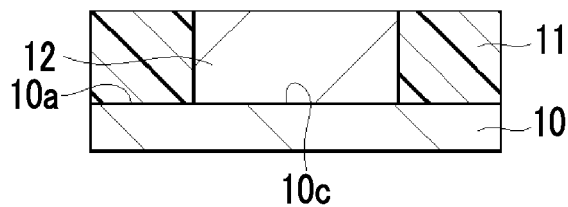
FIG. 1 is a schematic cross-sectional view showing one step of a first example of a method of manufacturing a structure according to an embodiment of the present invention.

Hereinafter, a method of manufacturing a structure according to the present invention will be described in detail based on a preferred embodiment shown in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where ε is a numerical value α to a numerical value β, the range ε is a range including the numerical value α and the numerical value β, which is expressed by a mathematical symbol $\alpha \leq \varepsilon \leq \beta$.

Unless specified otherwise, the meaning of an angle such as "perpendicular" includes a case where an error range is generally allowable in the technical field. Unless specified otherwise, the meaning of an environment represented by a temperature, a humidity, or an atmosphere includes a case where an error range is generally allowable in the technical field.

Here, the structure includes an electrode or an element region. Examples of the structure including an electrode a semiconductor element that exhibits a specific function by itself. However, a plurality of structures including an electrode that exhibit a specific function are also included. Further, a structure such as a wiring member that transmits an electrical signal is also included, and a printed wiring board or the like is also included in the structure including an electrode.

The element region is a region where various element component circuits are formed in order to function as an electronic element. Examples of the element region include a region where a memory circuit such as a flash memory or a logical circuit such as a microprocessor and a field-programmable gate array (FPGA) are formed and a region a communication module such as an RFID tag and a wiring line are formed. In addition to the above-described examples, micro electro mechanical systems (MEMS) may be formed in the element region. Examples of the MEMS include a sensor, an actuator, and an antenna. Examples of the sensor include various sensors for acceleration, sound, light, and the like.

As described above, in the element region, the element component circuits and the like are formed, and an electrode (not shown) is provided for electrical connection of a semiconductor chip to an external apparatus. The element region includes an electrode region where an electrode is formed. Examples of the electrode in the element region include a Cu post. Basically, the electrode region refers to a region including all of the formed electrodes. However, in a case where electrodes are provided to be spaced from each other, a region where each of the electrodes is provided also refers to an electrode region.

A form of the structure may be a diced piece such as a semiconductor chip, may be a form such as a semiconductor wafer, or may be a form of a wiring layer.

First Example of Method of Manufacturing Structure

FIGS. 1 to 8 are schematic cross-sectional views showing a first example of a method of manufacturing a structure according to the embodiment of the present invention in order of steps. The first example of the method of manufacturing the structure shown in FIGS. 1 to 8 will be described by using a structure where an element region 10c is provided on a surface 10a of an insulating support 10 as an example.

As shown in FIG. 1, first, a conductive layer forming step of forming a conductive layer 12 having conductivity on a part of the surface 10a of the insulating support 10 including at least one surface.

For example, the surface 10a of the insulating support 10 includes the element region 10c. In the conductive layer forming step, the conductive layer 12 is formed on the element region 10c of the surface 10a of the insulating support 10. The conductive layer 12 is formed on only the element region 10c, and the conductive layer 12 is partially formed on the surface 10a of the insulating support 10.

In order to form the conductive layer 12, first, a resist layer 11 is formed on the surface 10a of the insulating support 10, and the resist layer 11 on the element region 10c is removed, for example, by patterning using photolithography. Next, for example, a sheet layer (not shown) is formed on the resist layer 11, and the conductive layer 12 is formed by plating. In a case where the conductive layer 12 is formed, surfaces of the resist layer 11 and the conductive layer 12 are planarized by a planarization treatment. The conductive layer 12 is formed by plating, but a method of forming the conductive layer 12 is not particularly limited. However, in a film forming method where the temperature is high, the temperature of the element region 10c increases, which leads to a malfunction or the like. Therefore, it is preferable to use a film forming method where the temperature is low.

Figure 2:
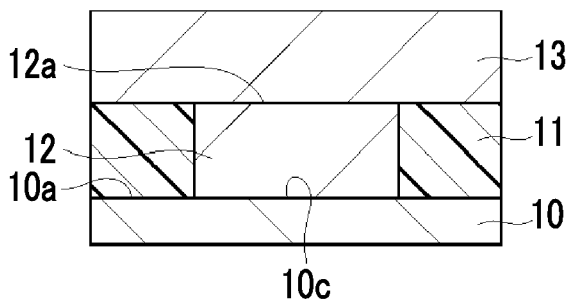
FIG. 2 is a schematic cross-sectional view showing one step of the first example of the method of manufacturing the structure according to an embodiment of the present invention.

Next, as shown in FIG. 2, a valve metal layer forming step of forming a valve metal layer 13 that covers at least a part of the conductive layer 12 is performed. In the valve metal layer forming step, for example, the valve metal layer 13 is formed on a surface 12a of the conductive layer 12 and a surface of the resist layer 11 using a vapor deposition method. As the valve metal, for example aluminum is used without any particular limitation. In the valve metal layer forming step, it is preferable to form the valve metal layer at a temperature of the insulating support 10 of 60° C. or lower. Even in a case where the temperature is high during the formation of the valve metal layer 13, the temperature of the element region 10c increases, which leads to a malfunction or the like. Therefore, it is preferable that the temperature is 60° C. or lower. In addition, it is preferable that the temperature is low during the formation of the conductive layer 12. Even in this case, it is preferable that the temperature is 60° C. or lower.

Figure 3:
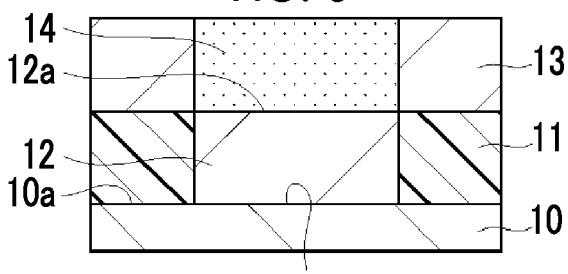
FIG. 3 is a schematic cross-sectional view showing one step of the first example of the method of manufacturing the structure according to an embodiment of the present invention.

Next, as shown in FIG. 3, an anodic oxidation film forming step of forming an anodic oxidation film 14 by performing an anodization treatment on the valve metal layer 13 in a region on the conductive layer 12 using the conductive layer 12 as an electrode. In the anodic oxidation film forming step, for example, the anodization treatment is performed in an oxalic acid aqueous solution by using the conductive layer 12 as a cathode of the electrode and using the valve metal layer 13 as an anode of the electrode. As a result, the valve metal layer 13 on the conductive layer 12 is anodized to form the anodic oxidation film 14. For example, in a case where an extraction electrode is provided on the conductive layer 12, a direct current is applied to the conductive layer 12 using the extraction electrode.

In a case where the valve metal layer 13 is formed of aluminum, the anodic oxidation film 14 is formed of aluminum oxide.

Figure 4:
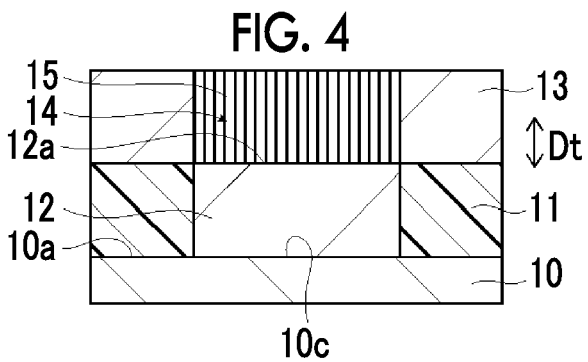
FIG. 4 is a schematic cross-sectional view showing one step of the first example of the method of manufacturing the structure according to an embodiment of the present invention.

Next, a micropore forming step of forming a plurality of micropores that extend in a thickness direction Dt on the anodic oxidation film 14 is performed. In a case where the anodic oxidation film 14 is formed, the plurality of micropores extend. However, among the plurality of micropores, micropores that penetrate in the thickness direction Dt are also present. In addition, a barrier layer (not shown) is present in a bottom portion of the micropore. Therefore, it is preferable that the micropore forming step includes a step of exposing the conductive layer 12 by expanding the diameter of the micropores in the anodic oxidation film 14 shown in FIG. 3 and removing the barrier layer to form a plurality of through-holes 15 through the anodic oxidation film 14 in the thickness direction Dt as shown in FIG. 4.

In order to expand the diameter of the micropores, a pore widening treatment is used. The pore widening treatment is a treatment of expanding the diameter of the micropores by dipping the anodic oxidation film in an acid aqueous solution or an alkali aqueous solution to dissolve the anodic oxidation film. In the pore widening treatment, an aqueous solution of an inorganic acid such as sulfuric acid, phosphoric acid, nitric acid, or hydrochloric acid or a mixture thereof or an aqueous solution of sodium hydroxide, potassium hydroxide, lithium oxide, or the like can be used.

In order to remove the barrier layer, by using an alkali aqueous solution including ions of a metal M1 having a higher hydrogen overvoltage than the valve metal layer, the barrier layer of the anodic oxidation film 14 is removed. Concurrently, a metal layer (not shown) that is formed of, for example, the metal (metal M1) as a conductive material is formed in the bottom portion of the micropore.

With the pore widening treatment, the barrier layer in the bottom portion of the micropore can be removed, and by using a sodium hydroxide aqueous solution in the pore widening treatment, the diameter of the micropores is expanded and the barrier layer is removed.

Next, a valve metal layer removing step of removing the valve metal layer 13 having undergone the anodic oxidation film forming step is performed after forming the plurality of through-holes 15 through the anodic oxidation film 14.

Figure 5:
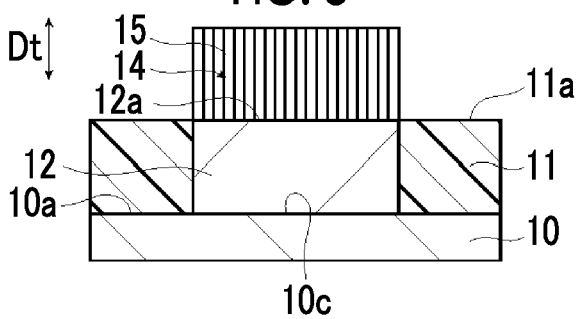
FIG. 5 is a schematic cross-sectional view showing one step of the first example of the method of manufacturing the structure according to an embodiment of the present invention.

In the anodization treatment, the conductive layer 12 is used as an electrode as described above, and the entirety of the valve metal layer 13 is not anodized. Therefore, the entirety of the valve metal layer 13 is not converted into the anodic oxidation film, and a region where the valve metal layer 13 remains even after the anodization treatment is present. In the valve metal layer removing step, the valve metal layer 13 that remains without being anodized is removed using a treatment liquid in which the anodic oxidation film 14 is insoluble and the valve metal layer 13 is soluble. As a result, as shown in FIG. 5, the valve metal layers 13 on both sides of the anodic oxidation film 14 are removed such that a surface 11a of the resist layer 11 is exposed. In a case where the valve metal layer 13 is formed of aluminum and the anodic oxidation film 14 is formed of aluminum oxide, a copper chloride aqueous solution is used as the treatment liquid.

Figure 6:
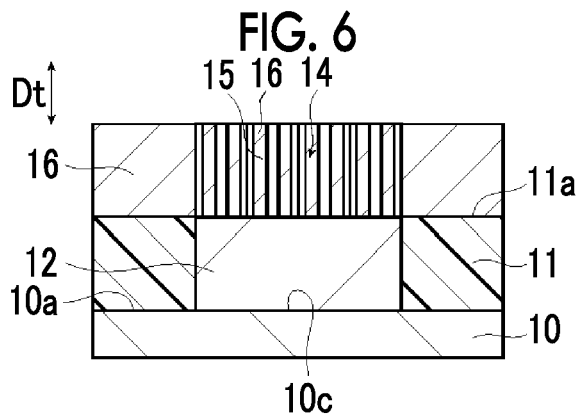
FIG. 6 is a schematic cross-sectional view showing one step of the first example of the method of manufacturing the structure according to an embodiment of the present invention.

Next, as shown in FIG. 6, a filling step of filling the plurality of micropores that penetrate the anodic oxidation film 14 in the thickness direction Dt, that is, the plurality of through-holes 15 with a conductive material is performed. In the filling step, a method of filling the plurality of micropores with the conductive material is not particularly limited. For example, the plurality of micropores of the anodic oxidation film are filled with the conductive material by electrolytic plating. As a result, the through-holes 15 are filled with the conductive material to form a plurality of conductive paths 16. The conductive paths 16 are formed of the filled conductive material and have conductivity.

The valve metal layer removing step is not particularly limited as long as it is performed between the anodic oxidation film forming step and the filling step. The valve metal layer removing step may be performed between the anodic oxidation film forming step and the micropore forming step or between the micropore forming step and the filling step.

Figure 7:
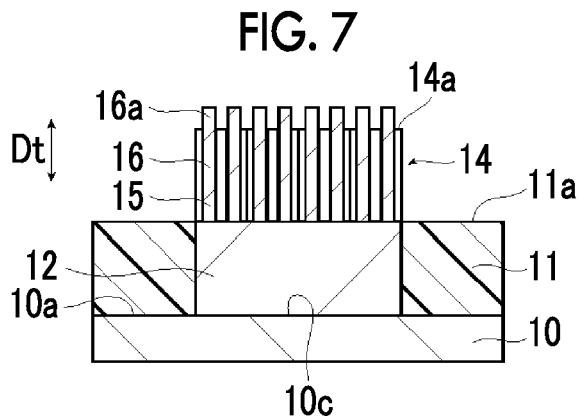
FIG. 7 is a schematic cross-sectional view showing one step of the first example of the method of manufacturing the structure according to an embodiment of the present invention.

Next, a protrusion step of causing the plurality of conductive paths 16 formed of the filled conductive material to protrude from the anodic oxidation film 14 is performed. Through the protrusion step, the plurality of conductive paths 16 are formed. In the protrusion step, as shown in FIG. 7, a part of the surface 14a of the anodic oxidation film 14 is removed, and the plurality of conductive paths 16 protrude from the anodic oxidation film 14. As a result, the conductive paths 16 are formed in the anodic oxidation film 14. The conductive path 16 includes a protrusion portion 16a that protrudes from the surface 14a of the anodic oxidation film 14.

Figure 8:
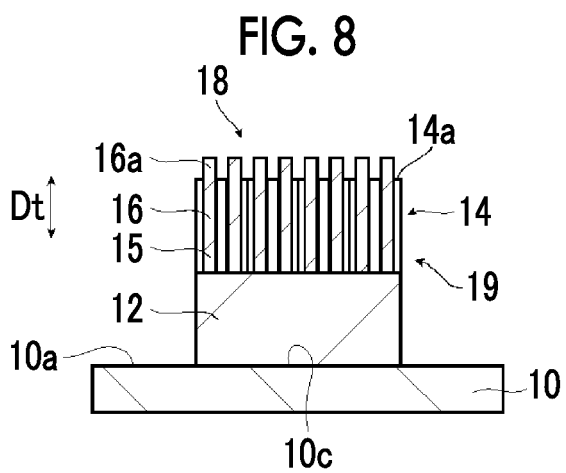
FIG. 8 is a schematic cross-sectional view showing one step of the first example of the method of manufacturing the structure according to an embodiment of the present invention.

Next, the resist layer 11 is removed to obtain a structure 18 shown in FIG. 8. In the structure 18, the plurality of conductive paths 16 extend in the thickness direction Dt of the anodic oxidation film 14 having electric insulating characteristics to be spaced from each other. Due to the above-described structure, the structure 18 has conductivity in the thickness direction Dt and has anisotropic conductivity. In the structure 18, the anodic oxidation film 14 including the conductive path 16 will also be referred to as a conductive member 19, and the conductive member 19 has anisotropic conductivity. In the structure 18, the conductive member 19 is formed on the conductive layer 12, and the conductive member 19 having selectively anisotropic conductivity is formed such that conductivity during bonding is secured.

The structure 18 is aligned with and bonded to a bonding target such that a bonded body can be obtained. By providing the conductive path 16, even in a case where unevenness is present on the bonding surface, the conductive path 16 follows the unevenness of the bonding surface. Therefore, the mirror-surfacing by CMP that is necessary in the hybrid bonding is unnecessary. In addition, the environment during bonding does not also need to be strictly managed and can be selected from the air, an inert atmosphere such as a nitrogen atmosphere, and a pressure reduced atmosphere such as a vacuum atmosphere. Furthermore, a typical wafer bonding device can be used. This way, the structure obtained using the above-described manufacturing method can be easily bonded to a bonding target.

In the method of manufacturing the structure 18, a resin layer forming step of forming a resin layer on thee protrusion portion 16a of the surface 14a of the anodic oxidation film 14 of the conductive path 16 may be performed. The resin layer in the resin layer forming step functions to be bonded to a bonding target and functions as a protective layer of the conductive path 16. Unless the protrusion portion 16a is provided in the conductive path 16, the protrusion step does not need to be performed. Unless the protrusion portion 16a is provided, the resin layer forming step does not need to be performed.

Second Example of Method of Manufacturing Structure

Figure 9:
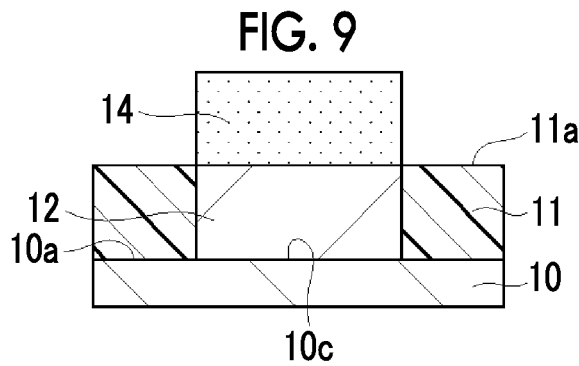
FIG. 9 is a schematic cross-sectional view showing one step of a second example of the method of manufacturing the structure according to an embodiment of the present invention.
Figure 10:
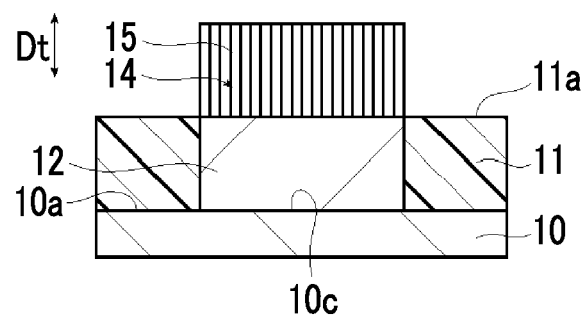
FIG. 10 is a schematic cross-sectional view showing one step of the second example of the method of manufacturing the structure according to an embodiment of the present invention.

FIGS. 9 and 10 are schematic cross-sectional views showing a second example of the method of manufacturing the structure according to the embodiment of the present invention in order of steps. In FIGS. 9 and 10, the same structures in the method of manufacturing the structure shown in FIGS. 1 to 8 will be represented by the same reference numerals, and the detailed description thereof will not be repeated.

A timing at which the valve metal layer removing step is performed is not particularly limited as long as it is between the anodic oxidation film forming step and the filling step. The valve metal layer removing step may be performed between the anodic oxidation film forming step and the micropore forming step.

The second example of the method of manufacturing the structure is different from the first example of the method of manufacturing the structure, in that it includes the valve metal layer removing step of removing, as shown in FIG. 9, the valve metal layer 13 that is not anodized after the anodic oxidation film forming step shown in FIG. 3 and that the micropore forming step is performed on the anodic oxidation film 14 in a state where the valve metal layer 13 shown in FIG. 9 is removed. The other steps are the same as those of the first example of the method of manufacturing the structure.

In the second example of the method of manufacturing the structure, the micropore forming step of forming the plurality of through-holes 15 in the anodic oxidation film 14 as shown in FIG. 10 after removing the valve metal layer 13 is performed. After forming the plurality of through-holes 15 through the anodic oxidation film 14, the filling step is performed, and the protrusion step is optionally performed. Even in the second example of the method of manufacturing the structure, the structure 18 shown in FIG. 8 can be obtained as in the first example of the method of manufacturing the structure.

Third Example of Method of Manufacturing Structure

Figure 11:
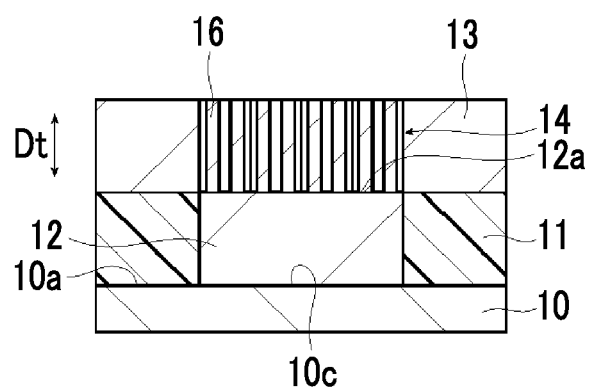
FIG. 11 is a schematic cross-sectional view showing one step of a third example of the method of manufacturing the structure according to an embodiment of the present invention.
Figure 12:
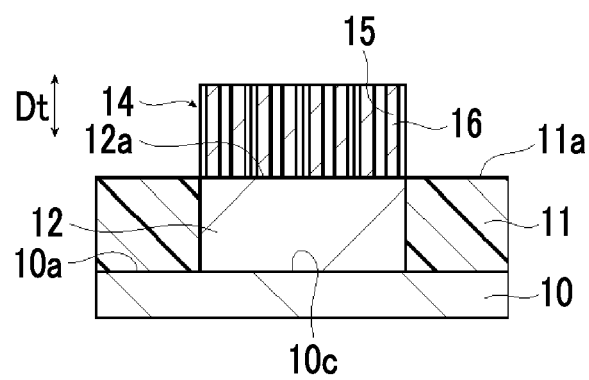
FIG. 12 is a schematic cross-sectional view showing one step of the third example of the method of manufacturing the structure according to an embodiment of the present invention.

FIGS. 11 and 12 are schematic cross-sectional views showing a third example of the method of manufacturing the structure according to the embodiment of the present invention in order of steps. In FIGS. 11 and 12, the same structures in the method of manufacturing the structure shown in FIGS. 1 to 8 will be represented by the same reference numerals, and the detailed description thereof will not be repeated.

In addition, the valve metal layer removing step may be performed after the filling step.

The third example of the method of manufacturing the structure is different from the first example of the method of manufacturing the structure, in that after the micropore forming step shown in FIG. 4, the valve metal layer removing step is not performed and the plurality of micropores of the anodic oxidation film 14, that is, the plurality of through-holes 15 are filled with the conductive material in a state where the valve metal layer 13 is present as shown in FIG. 11. Next, the third example of the method of manufacturing the structure is different from the first example of the method of manufacturing the structure, in that the valve metal layer 13 is removed as shown in FIG. 12, and the other steps are the same as those of the first example of the method of manufacturing the structure.

In the third example of the method of manufacturing the structure, after the plurality of through-holes 15 of the anodic oxidation film 14 are filled with the conductive material in a state where the valve metal layer 13 is present as shown in FIG. 11, the valve metal layer 13 is removed as shown in FIG. 12 using a treatment liquid in which the conductive material and the anodic oxidation film 14 are insoluble and the valve metal layer 13 is soluble such that the surface 11a of the resist layer 11 is exposed.

Next, as shown in FIG. 7, the protrusion portion 16a where the conductive path 16 protrudes from the surface 14a of the anodic oxidation film 14 is formed. Next, even in the third example of the method of manufacturing the structure, the structure 18 shown in FIG. 8 is obtained as in the first example of the method of manufacturing the structure, except for the resist layer 11.

Hereinafter, each of the steps of the method of manufacturing the structure will be further described.

[Conductive Layer Forming Step]

The conductive layer is provided in the element region, the wiring region, or the like of the insulating support such that a current or a voltage is applied to the element region, the wiring region, or the like or such that a current or a voltage is output to the element region, the wiring region, or the like.

The conductive layer being partially provided represents that, as described below, the element region or the wiring region is unevenly provided without being provided on the entire area of the insulating support. Therefore, the conductive layer that is provided in the element region or the wiring region is also unevenly distributed and partially provided.

The conductive layer is not particularly limited as long as it has conductivity. It is preferable that the conductive layer is formed of the same material as the filled conductive material and is formed of, for example, copper. That is, it is preferable that the conductive layer and the conductive path are formed of the same material. In a case where the conductive layer and the conductive material are formed of the same material, bonding between the conductive layer and the conductive material is improved, an increase in electrical resistance can be suppressed, and the occurrence of electromigration can also be suppressed. As a result, disconnection of a bonding portion between the conductive path and the conductive layer is suppressed, and the reliability of the conductive path is improved.

<Insulating Support>

The insulating support has at least one surface and specifically has at least one plane. The above-described element region, the wiring region, or the like is provided on the plane of the insulating support. However, the element region, the wiring region, or the like is unevenly provided without being provided on the entire area of the surface of the insulating support.

The element region, the wiring region, or the like is formed on the surface of the insulating support, specifically, various wafers such as a silicon wafer, and the surface of the insulating support is the surface of a wafer.

The insulating support is not particularly limited to the form of a wafer, and the wafer having a surface on which the element region, the wiring region, and the like are formed may be in the form of a diced chip for each element region or each wiring region.

[Valve Metal Layer Forming Step]

From the viewpoint that through-holes having a desired average opening diameter are formed as through-holes and the conductive path is likely to be formed, the anodic oxidation film is preferable. Therefore, the valve metal layer is formed.

A method of forming the valve metal layer is not particularly limited. For example, the valve metal layer is formed using a sputtering method, a vapor deposition method, or a plating method. Further, the valve metal layer can also be formed using a plurality of methods thereof in combination. However, in a case where the valve metal layer is formed as described above, the temperature of the insulating support is preferably 60° C. or lower. In this case, for example, the formation of the valve metal layer is performed by placing the insulating support on a cooling plate and holding the temperature of the insulating support at 60° C. or lower.

Here, specific examples of the valve metal forming the valve metal layer include aluminum, tantalum, niobium, titanium, hafnium, zirconium, zinc, tungsten, bismuth, and antimony. Among these, from the viewpoint of higher dimension stability and a relatively low cost, an aluminum anodic oxidation film is preferable. Therefore, it is preferable that the anodic oxidation film is formed using aluminum as the valve metal.

<Aluminum>

Aluminum is not particularly limited, and specific examples thereof include pure aluminum and an aluminum alloy including aluminum as a major component and further including a small amount of different element.

The aluminum purity is preferably 99.5 mass % or higher, more preferably 99.9 mass % or higher, and still more preferably 99.99 mass % or higher. In a case where the aluminum purity is within the above-described range, the regularity of through-hole arrangement is sufficient.

In addition, in the valve metal layer formed of aluminum, it is preferable that a heat treatment, a degreasing treatment, and a mirror finishing treatment are performed in advance on the surface on which the anodization treatment step is performed.

Here, regarding the heat treatment, the degreasing treatment, and the mirror finishing treatment, the same treatment as each treatment described in paragraphs "0044" to "0054" of JP2008-270158A can be performed.

[Anodic Oxidation Film Forming Step]

The anodic oxidation film forming step is a step of performing the anodization treatment on the valve metal layer by using the above-described conductive layer as an electrode.

For the anodization treatment, a well-known method of the related art can be used, but it is preferable that a self-regulation method or a constant voltage treatment is used from the viewpoints of obtaining high regularity of through-hole arrangement and securing the anisotropic conductivity of the conductive member 19.

Here, regarding the self-regulation method and the constant voltage treatment for the anodization treatment, the same treatment as each treatment described in paragraphs "0056" to "0108" and FIG. 3 of JP2008-270158A can be performed.

<Anodization Treatment>

The average flow rate of an electrolytic solution in the anodization treatment is preferably 0.5 to 20.0 m/min, more preferably 1.0 to 15.0 m/min, and still more preferably 2.0 to 10.0 m/min.

In addition, a method of causing the electrolytic solution to flow under the above-described conditions is not particularly limited. For example, a method of using a general stirring device such as a stirrer is used. In particular, in a case where a stirrer that can control a stirring rate based on digital display is used, the average flow rate can be controlled, which is preferable. Examples of the stirring device include "magnetic stirrer HS-50D (manufactured by AS ONE Corporation)".

In the anodization treatment, a method of performing energization in a solution having an acid concentration of 1 to 10 mass % by using the above-described conductive layer as a cathode and using the above-described valve metal layer as an anode.

As the solution used in the anodization treatment, an acid aqueous solution is preferable, sulfuric acid, phosphoric acid, chromic acid, oxalic acid, benzenesulfonic acid, amidesulfonic acid, glycolic acid, tartaric acid, malic acid, citric acid, or the like is more preferable, and sulfuric acid, phosphoric acid, or oxalic acid is still more preferable. These acids can be used alone or in combination of two or more kinds.

Although conditions of the anodization treatment change in various ways depending on the electrolytic solution to be used, in general, in general, it is preferable that the electrolytic solution concentration is 0.1 to 20 mass %, the liquid temperature is −10° C. to 30° C., the current density is 0.01 to 20 A/dm$^2$, the voltage is 3 to 300 V, and the electrolysis time is 0.5 to 30 hours, it is more preferable that the electrolytic solution concentration is 0.5 to 15 mass %, the liquid temperature is −5° C. to 25° C., the current density is 0.05 to 15 A/dm$^2$, the voltage is 5 to 250 V, and the electrolysis time is 1 to 25 hours, it is still more preferable that the electrolytic solution concentration is 1 to 10 mass %, the liquid temperature is 0° C. to 20° C., the current density is 0.1 to 10 A/dm$^2$, the voltage is 10 to 200 V, and the electrolysis time is 2 to 20 hours.

The thickness of the anodic oxidation film formed in the anodization treatment is preferably 30 μm or less and more preferably 5 to 20 μm. The thickness of the anodic oxidation film can be obtained, for example, using a method including: cutting the anodic oxidation film in the thickness direction with a focused ion beam (FIB); observing a surface image (magnification: 50000-fold) of a cross-section thereof using a field emission scanning electron microscope (FE-SEM); and calculating the average value of thicknesses measured at 10 points.

[Holding Step]

The method of manufacturing the structure may include a holding step. The holding step is a step of holding the voltage to be 95% or higher and 105% or lower with respect to a holding voltage selected from in a range of 1 V or more to a voltage lower than 30% of the voltage in the above-described anodization treatment step for 5 minutes or longer in total after the above-described anodization treatment step.

In other words, the holding step is a step of performing an electrolytic treatment at a voltage that is 95% or higher and 105% or lower with respect to a holding voltage selected from in a range of 1 V or more to a voltage lower than 30% of the voltage in the above-described anodization treatment step for 5 minutes or longer in total after the above-described anodization treatment step.

Here, "the voltage in the anodization treatment" refers to a voltage to be applied between the valve metal layer and the conductive layer and, for example, in a case where the electrolysis time in the anodization treatment is 30 minutes, refers to the average value of voltage held for 30 minutes.

From the viewpoint of controlling the side wall thickness of the anodic oxidation film, that is, the thickness of the barrier layer with respect to the depth of the through-hole to be an appropriate thickness, the voltage in the holding step is preferably 5% or higher and 25% or lower and more preferably 5% or higher and 20% or lower with respect to the voltage in the anodization treatment.

In addition, from the viewpoint of further improving the in-plane uniformity, the total holding time in the holding step is preferably 5 minutes or longer and 20 minutes or shorter, more preferably 5 minutes or longer and 15 minutes or shorter, and still more preferably 5 minutes or longer and 10 minutes or shorter.

In addition, the holding time in the holding step may be 5 minutes or longer in total and preferably continuous 5 minutes or longer.

Further, the voltage in the holding step may be set to decrease continuously or stepwise from the voltage in the anodization treatment step to the voltage in the holding step. From the viewpoint of further improving the in-plane uniformity, it is preferable that the voltage in the holding step is set to be 95% or higher and 105% or lower with respect to the above-described holding voltage within one second after completion of the anodization treatment step.

By decreasing the electrolytic potential at the completion of the above-described anodization treatment step, for example, the above-described holding step can also be performed continuously after the above-described anodic oxidation film forming step.

In the holding step, regarding conditions other than the electrolytic potential, the same electrolytic solution and treatment conditions as in the above-described well-known anodization treatment of the related art can be adopted.

In particular, in a case where the holding step and the anodic oxidation film forming step are continuously performed, it is preferable that the holding step and the anodic oxidation film forming step are performed using the same electrolytic solution.

[Micropore Forming Step]
<Barrier Layer Removal Step>

The barrier layer removal step is a step of removing the barrier layer of the anodic oxidation film using an alkali aqueous solution including ions of the metal M1 having a higher hydrogen overvoltage than aluminum.

In the above-described barrier layer removal step, the barrier layer is removed, and a metal layer formed of the metal M1 is formed in the bottom portion of the micropore.

Here, the hydrogen overvoltage refers to a voltage required to produce hydrogen. For example, the hydrogen overvoltage of aluminum (Al) is −1.66 (Journal of the Chemical Society of Japan, 1982 (8), p 1305-1313). Examples of the metal M1 having a higher hydrogen overvoltage than aluminum and the values of hydrogen overvoltage thereof will be shown below.

<Metal M1 and Hydrogen ($1N \cdot H_2SO_4$) Overvoltage>
Platinum (Pt):0.00 V
Gold (Au):0.02 V
Silver (Ag):0.08 V
Nickel (Ni): 0.21 V
Copper (Cu):0.23 V
Tin (Sn):0.53 V
Zinc (Zn):0.70 V From the viewpoint of reducing the influence electrical characteristics of a metal that is filled in the through-hole due to the occurrence of a substitution reaction with to metal M2 that is filled in the anodic oxidation film forming step, it is preferable that the metal M1 used in the bather layer removal step is a metal having higher ionization tendency than the metal M2 used in the filling step.

Specifically, in a case where copper (Cu) is used as the metal M2 of the filling step, examples of the metal M1 used in the barrier layer removal step include Zn, Fe, Ni, and Sn. In particular, it is preferable to use Zn or Ni, and it is more preferable to use Zn.

In addition, in a case where NI is used as the metal M2 of the filling step, examples of the metal M1 used in the barrier layer removal step include Zn, Fe. In particular, it is preferable to use Zn.

A method of removing the bather layer using the alkali aqueous solution including the ions of the metal M1 is not particularly limited, and examples thereof include the same method as that of a well-known chemical etching treatment in the related art.

<Chemical Etching Treatment>

During the removal of the barrier layer through the chemical etching treatment, for example, only the barrier layer can be selectively dissolved by bringing a surface of the anodic oxidation film on a through-hole-opening side into contact with a pH (hydrogen ion exponent) buffer solution after dipping the structure having undergone the anodization treatment step in an alkali aqueous solution such that the inside of the through-holes is filled with the alkali aqueous solution.

Here, as the alkali aqueous solution including the ions of the metal M1, it is preferable to use an aqueous solution of at least one alkali selected from the group consisting of sodium hydroxide, potassium hydroxide, and lithium oxide. In addition, the concentration of the alkali aqueous solution is preferably 0.1 to 5 mass %. The temperature of the alkali aqueous solution is preferably 10° C. to 60° C., more preferably 15° C. to 45° C., and still more preferably 20° C. to 35° C.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is suitably used.

As the pH buffer solution, a buffer solution corresponding to the alkali aqueous solution can be appropriately used.

In addition, the time of dipping in the alkali aqueous solution is preferably 5 minutes to 120 minutes, more preferably 8 minutes to 120 minutes, still more preferably 8 minutes to 90 minutes, and even still more preferably 10 minutes to 90 minutes. In particular, the time of dipping is preferably 10 minutes to 60 minutes and more preferably 15 minutes to 60 minutes.

Other Examples of Barrier Layer Removal Step

In addition to the above-described example, the barrier layer removal step may be a step of removing the barrier layer of the anodic oxidation film such that the conductive layer is exposed from the bottom of the through-hole.

A method of removing the barrier layer is not particularly limited, and examples thereof include a method of electrochemically dissolving the barrier layer at a potential lower than that in the anodization treatment of the anodic oxidation film forming step (hereinafter, also referred to as "electrolytic removal treatment"); a method of removing the barrier layer by etching (hereinafter, also referred to as "etching removal treatment"); and a combination of the above-described methods (in particular, a method of removing the barrier layer remaining after the electrolytic removal treatment through the etching removal treatment).

<Electrolytic Removal Treatment>

The electrolytic removal treatment is not particularly limited as long as it is an electrolytic treatment which is performed at a potential (electrolytic potential) lower than that in the anodization treatment of the anodic oxidation film forming step.

The electrolytic dissolution treatment can be continuously performed after the anodization treatment by decreasing the electrolytic potential at the time of completion of the anodic oxidation film forming step.

In the electrolytic removal treatment, regarding conditions other than the electrolytic potential, the same electrolytic solution and treatment conditions as in the above-described well-known anodization treatment of the related art can be adopted.

In particular, in a case where the electrolytic removal treatment and the anodization treatment are continuously performed as described above, it is preferable that the same electrolytic solution is used during the treatments.

(Electrolytic Potential)

It is preferable that the electrolytic potential in the electrolytic removal treatment is decreased continuously or stepwise at a potential lower than that in the anodization treatment.

Here, in a case where the electrolytic potential is decreased stepwise, the decrease width, that is, the step width is preferably 10 V or lower, more preferably 5 V or lower, and still more preferably 2 V or lower from the viewpoint of the withstand voltage of the barrier layer.

In addition, in a case where the electrolytic potential is decreased continuously or stepwise, the voltage decrease rate is preferably 1 V/sec or lower, more preferably 0.5 V/sec or lower, and still more preferably 0.2 V/sec or lower from the viewpoints of productivity and the like.

<Etching Removal Treatment>

The etching removal treatment is not particularly limited and may be a chemical etching treatment in which the battery layer is dissolved using an acid aqueous solution or an alkali aqueous solution or may be a dry etching treatment.

(Chemical Etching Treatment)

During the removal of the barrier layer through the chemical etching treatment, for example, only the barrier layer can be selectively dissolved by bringing a surface of the anodic oxidation film on a micropore-opening side into contact with a pH (hydrogen ion exponent) buffer solution after dipping the structure having undergone the anodization treatment step in an acid aqueous solution or an alkali aqueous solution such that the inside of the micropores is filled with the acid aqueous solution and the alkali aqueous solution.

Here, in a case where the acid aqueous solution is used, it is preferable that an inorganic acid such as sulfuric acid, phosphoric acid, nitric acid, or hydrochloric acid or an aqueous solution of a mixture of the above inorganic acids is used. In addition, the concentration of the acid aqueous solution is preferably 1 to 10 mass %. The temperature of the acid aqueous solution is preferably 15° C. to 80° C., more preferably 20° C. to 60° C., and still more preferably 30° C. to 50° C.

On the other hand, in a case where the alkali aqueous solution is used, it is preferable that an aqueous solution of at least one alkali selected from the group consisting of sodium hydroxide, potassium hydroxide, and lithium oxide is used. In addition, the concentration of the alkali aqueous solution is preferably 0.1 to 5 mass %. The temperature of the alkali aqueous solution is preferably 10° C. to 60° C., more preferably 15° C. to 45° C., and still more preferably 20° C. to 35° C. The alkali aqueous solution may include zinc and other metal.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is suitably used.

As the pH buffer solution, a buffer solution corresponding to the acid aqueous solution or the alkali aqueous solution can be appropriately used.

In addition, the time of dipping in the acid aqueous solution or the alkali aqueous solution is preferably 8 minutes to 120 minutes, more preferably 10 minutes to 90 minutes, and still more preferably 15 minutes to 60 minutes.

(Dry Etching Treatment)

In the dry etching treatment, for example, it is preferable that a gas species such as $Cl_2$/Ar mixed gas is used.

[Filling Step]

The filling step is a step of filling the plurality of micropores of the anodic oxidation film with, for example, with the metal M2 as a conductive material by electrolytic plating after the barrier layer removal step. Through the filling step, the conductive path is formed.

<Metal M2>

It is preferable that the metal M2 is a material having an electrical resistivity of $10^3$ Ω·cm or lower, and preferable specific examples thereof include gold (Au), silver (Ag), copper (Cu), aluminum (Al), magnesium (Mg), nickel (Ni), and zinc (Zn).

In particular, from the viewpoint of electrical conductivity, Cu, Au, Al, or Ni is preferable, Cu or Au is more preferable, and Cu is still more preferable.

In the description of the filling step, the metal is filled. However, the conductive path is not limited to the metal and may be an oxide conductor or the like as long as the oxide conductor or the like is a conductive material. Therefore, for example, tin oxide doped with indium (ITO) may be filled instead of the metal.

However, the metal is superior to the oxide conductor in ductility or the like, is likely to be deformed, and is likely to be deformed even during compression for bonding. Therefore, it is preferable that the conductive path is formed of a metal. Among these metals, Cu or Au is more preferable because it has not only the above-described electrical conductivity but also a characteristic of being likely to be deformed during compression, and Cu is still more preferable in consideration of the costs and the like.

<Filling Method>

As a plating method for filling the micropores with the metal M2, for example, an electrolytic plating method or an electroless plating method can be used.

Here, in a well-known electrolytic plating method of the related art used for coloration or the like, it is difficult to selectively precipitate (grow) a metal in holes at a high aspect ratio. The reason for this is presumed to be that the precipitated metal is consumed in the holes such that the plating does not grow even after performing electrolysis for a given period of time or longer.

Therefore, in a case where the metal is filled using an electrolytic plating method, it is necessary to provide the downtime during pulse electrolysis or constant potential electrolysis. The downtime is necessarily 10 seconds or longer and preferably 30 to 60 seconds.

In addition, in order to promote the stirring of the electrolytic solution, it is desirable to apply ultrasonic waves.

Further, the electrolysis voltage is typically 20 V or lower and preferably 10 V or lower. It is preferable that the deposition potential of a desired metal in an electrolytic solution to be used is measured in advance such that the constant potential electrolysis is performed within the measured potential +1 V. In a case where the constant potential electrolysis is performed, a device that can also perform cyclic voltammetry is preferable, and potentiometers manufactured by Solartron ISA, BAS Inc., Hokuto Denko Corp., and IVIUM Technologies B.V. can be used.

As the plating solution, a well-known plating solution of the related art can be used.

Specifically, in a case where copper is precipitated, a copper sulfate aqueous solution is generally used, in which the concentration of copper sulfate is preferably 1 to 300 g/L and more preferably 100 to 200 g/L. In addition, in a case where hydrochloric acid is added to the electrolytic solution, precipitation can be promoted. In this case, the hydrochloric acid concentration is preferably 10 to 20 g/L.

In a case where gold is precipitated, it is desirable to perform plating by alternating current electrolysis using a sulfuric acid solution of tetrachloroaurate.

In the electroless plating method, a long period of time is required to completely fill the holes formed of micropores having a high aspect ratio with the metal. Therefore, in the manufacturing method according to the embodiment of the present invention, it is desirable to fill the metal using the electrolytic plating method.

In the present invention, in the above-described barrier layer removal step, the barrier layer is removed, and the metal layer formed of the metal M1 is formed in the bottom portion of the micropore. As described above, the production of hydrogen gas by the plating solution is suppressed, and it is presumed that the metal filling by the plating treatment is likely to progress.

<Pore Widening Treatment>

The pore widening treatment is a treatment of expanding the pore diameter of the micropores by dipping an aluminum member in an acid aqueous solution or an alkali aqueous solution to dissolve the anodic oxidation film.

As a result, the regularity of the arrangement of the micropores and a variation in pore diameter are easily controlled. In addition, by dissolving the barrier film of the anodic oxidation film in the bottom portions of the plurality of micropores, the anodic oxidation film can selectively electrodeposited in the micropores, and the pore diameter can be expanded such that the surface area as an electrode can be significantly increased.

Here, in a case where the acid aqueous solution is used for the pore widening treatment, it is preferable that an inorganic acid such as sulfuric acid, phosphoric acid, nitric acid, or hydrochloric acid or an aqueous solution of a mixture of the above inorganic acids is used. In addition, the concentration of the acid aqueous solution is preferably 1 to 10 mass %. The temperature of the acid aqueous solution is preferably 25° C. to 40° C.

On the other hand, in a case where the alkali aqueous solution is used for the pore widening treatment, it is preferable that an aqueous solution of at least one alkali selected from the group consisting of sodium hydroxide, potassium hydroxide, and lithium oxide is used. The concentration of the alkali aqueous solution is preferably 0.1 to 5 mass %. The temperature of the alkali aqueous solution is preferably 20° C. to 35° C.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is suitably used.

In addition, the dipping time in the acid aqueous solution or the alkali aqueous solution is preferably 8 to 60 minutes, more preferably 10 to 50 minutes, still more preferably 15 to 30 minutes.

[Valve Metal Layer Removing Step]

The valve metal layer removing step is a step of removing the above-described valve metal layer. A method of removing the valve metal layer is not particularly limited. For example, a method of removing the aluminum substrate by dissolving is suitably used. In the valve metal layer removing step, it is preferable to use a treatment liquid in which the anodic oxidation film is insoluble and the valve metal layer is soluble.

<Dissolution of Aluminum>

As described above, in a case where the valve metal layer is formed of aluminum, during the dissolution of aluminum, a treatment liquid in which the anodic oxidation film is not easily dissolved and aluminum is easily dissolved is preferably used.

The dissolution rate of aluminum in the treatment liquid is preferably 1 μm/min or higher, more preferably 3 μm/min or higher, and still more preferably 5 μm or higher. Likewise, the dissolution rate of the anodic oxidation film in the treatment liquid is preferably 0.1 nm/min or lower, more preferably 0.05 nm/min or lower, and still more preferably 0.01 nm/min or lower.

Specifically, it is preferable that the treatment liquid contains at least one metal compound having lower ionization tendency than aluminum and has pH of 4 or lower or 8 or higher. The pH is more preferably 3 or lower or 9 or higher and 2 or lower or 10 or higher.

It is preferable that the treatment liquid for dissolving aluminum is obtained by blending the acid or alkali aqueous solution as a base with, for example, manganese, zinc, chromium, iron, cadmium, cobalt, nickel, tin, lead, antimony, bismuth, copper, mercury, silver, palladium, platinum, a gold compound (for example, chloroplatinic acid), a fluoride thereof, or a chloride thereof.

Among these, it is preferable that the acid aqueous solution as a base is blended with a chloride.

In particular, a treatment liquid (hydrochloric acid/mercury chloride) obtained by blending mercury chloride with the hydrochloric acid aqueous solution or a treatment liquid (hydrochloric acid/copper chloride) obtained by blending copper chloride with the hydrochloric acid aqueous solution is preferable from the viewpoint of treatment latitude.

The composition of the treatment liquid for dissolving aluminum is not particularly limited. For example, a bromine-methanol mixture, a bromine-ethanol mixture, or aqua regia can be used.

In addition, the concentration of the acid or alkali in the treatment liquid for dissolving aluminum is preferably 0.01 mol/L to 10 mold, and more preferably 0.05 mol/L to 5 mol/L.

Further, the treatment temperature in the treatment liquid for dissolving aluminum is preferably −10° C. to 80° C. and more preferably 0° C. to 60° C.

In addition, the dissolution of aluminum is performed by bringing the aluminum substrate after the filling step into contact with the above-described treatment liquid. A dipping method is not particularly limited, and examples thereof include a dip coating method and a spray coating method. Among these, a dip coating method is preferable. In this case, the contact time is preferably 10 seconds to 5 hours and more preferably 1 minute to 3 hours.

[Protrusion Step]

The protrusion step is a step of removing a part of the surface of the anodic oxidation film in the thickness direction after the filling step and causing a plurality of conductive paths formed of the filled conductive material such as the metal M2 to protrude from the anodic oxidation film in order to provide a protruding portion.

The partial removal of the anodic oxidation film in the protrusion step can be performed by bringing the anodic oxidation film having the through-holes filled with the conductive material into contact with an acid aqueous solution or an alkali aqueous solution in which the metal M1 and the metal M2 (in particular, the metal M2) is insoluble and the anodic oxidation film, for example, aluminum oxide is soluble. A dipping method is not particularly limited, and examples thereof include a dip coating method and a spray coating method. Among these, a dip coating method is preferable.

Here, in a case where the acid aqueous solution is used, it is preferable that an inorganic acid such as sulfuric acid, phosphoric acid, nitric acid, or hydrochloric acid or an aqueous solution of a mixture of the above inorganic acids is used. In particular, an aqueous solution not including chromic acid is preferable from the viewpoint of excellent safety. The concentration of the acid aqueous solution is preferably 1 to 10 mass %. The temperature of the acid aqueous solution is preferably 25° C. to 60° C.

In addition, in a case where the alkali aqueous solution is used, it is preferable that an aqueous solution of at least one alkali selected from the group consisting of sodium hydroxide, potassium hydroxide, and lithium oxide is used. The concentration of the alkali aqueous solution is preferably 0.1 to 5 mass %. The temperature of the alkali aqueous solution is preferably 20° C. to 35° C.

Specifically, for example, a phosphoric acid aqueous solution of 50 g/L and 40° C., a sodium hydroxide aqueous solution of 0.5 g/L and 30° C., or a potassium hydroxide aqueous solution of 0.5 g/L and 30° C. is suitably used.

The time of dipping in the acid aqueous solution or the alkali aqueous solution is preferably 8 to 120 minutes, more preferably 10 to 90 minutes, and still more preferably 15 to 60 minutes. Here, in a case where the short-term dipping treatment is repeated, the dipping time represents the total time of all the dipping treatments. A cleaning treatment may be performed between the respective dipping treatments.

<Structure>

Figure 13:
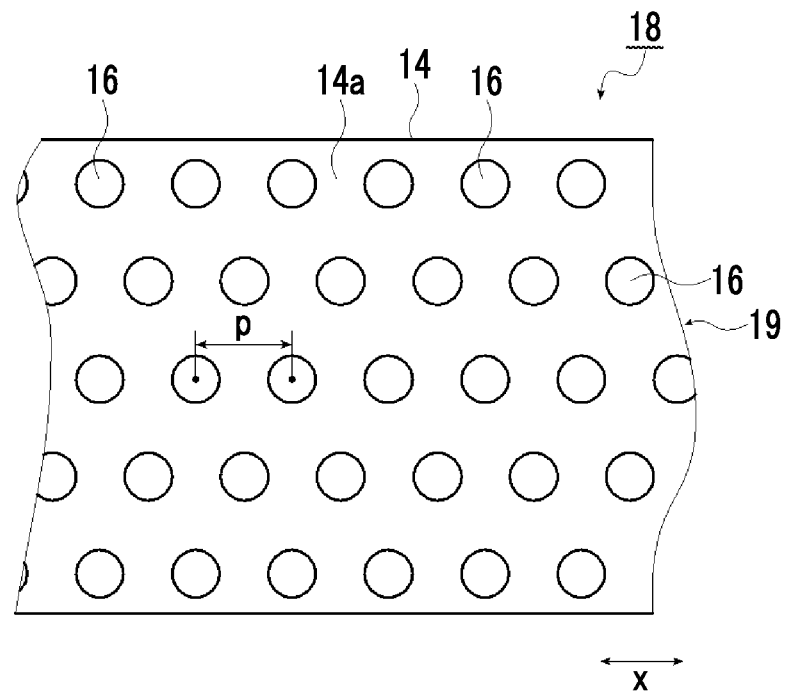
FIG. 13 is a schematic plan view showing one example of the structure according to the embodiment of the present invention.
Figure 14:
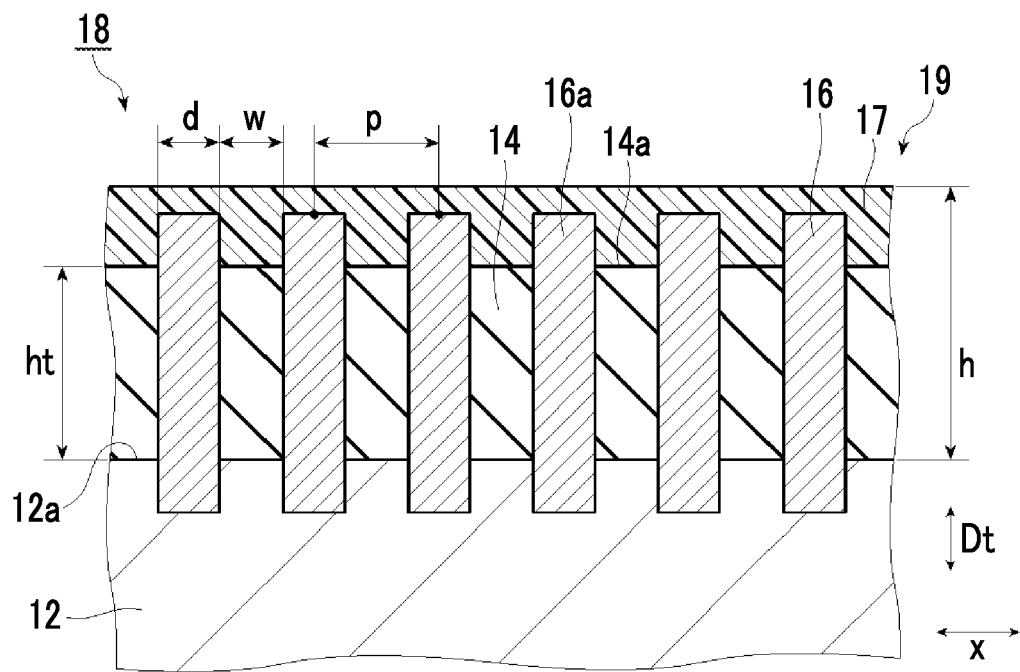
FIG. 14 is a schematic cross-sectional view showing one example of the structure according to the embodiment of the present invention.

FIG. 13 is a schematic plan view showing one example of the structure according to the embodiment of the present invention, and FIG. 14 is a schematic cross-sectional view showing one example of the structure according to the embodiment of the present invention.

As shown in FIGS. 13 and 14, in the structure 18, the plurality of conductive paths 16 are provided at intervals in the anodic oxidation film 14.

As shown in FIG. 14, the structure 18 includes the conductive layer 12 and the anodic oxidation film 14 that is provided on the conductive layer 12. The plurality of conductive paths 16 penetrate the anodic oxidation film 14 in the thickness direction Dt. Since the anodic oxidation film 14 has electrical insulating properties, the plurality of conductive paths 16 are provided in the anodic oxidation film 14 in a state where they are electrically insulated from each other.

The conductive member 19 is a member including: the anodic oxidation film 14; and the plurality of conductive paths 16 that are provided in the anodic oxidation film 14.

Here, "being electrically insulated from each other" represents that the conductivity between the respective conductors present in the insulating substrate is sufficiently low.

In the structure 18, the conductivity of the conductive member 19 in a direction x perpendicular to the thickness direction Dt (refer to FIG. 14) is sufficiently low, and the conductivity in the thickness direction Dt (refer to FIG. 14) is sufficient. The conductive member 19, is a member having anisotropic conductivity in which the conductive paths 16 are electrically insulated from each other.

Further, the structure 18 includes a resin layer 17 that is provided on the surface 14a of the anodic oxidation film 14. The resin layer 17 has viscosity and imparts bondability. The length of the protrusion portions 16a is preferably 6 nm or more and more preferably 30 nm to 500 nm.

The conductive path 16 may have a configuration in which the protrusion portion 16a shown in FIG. 14 is not provided.

A thickness h of the conductive member 19 shown in FIG. 14 is, for example, 30 μm or less. In addition, a total thickness variation (TTVV) of the conductive member 19 is preferably 10 μm or less.

Here, the thickness h of the conductive member 19 refers to an average value that is obtained by observing the conductive member 19 using a field emission scanning electron microscope at a magnification of 200000-fold, acquiring a contour shape of the conductive member 19, and obtaining the average of values measured at ten points of a region corresponding to the thickness h.

In addition, the total thickness variation (TTV) of the conductive member 19 is a value obtained by dicing the conductive member 19 and observing a cross-sectional shape of the conductive member 19.

In addition, a protective layer (not shown) may be provided in the resin layer 17. The protective layer is used for protecting the structure 18 surface from being damaged. Therefore, an easily peelable tape is preferable. As the protective layer, for example, a film with a pressure sensitive adhesive layer may be used.

As the film with a pressure sensitive adhesive layer, for example, a commercially available product having the following series names can be used: SUNYTECT (registered trade name; manufactured by Sun A. Kaken Co., Ltd.) obtained by forming an adhesive layer on a surface of a polyethylene resin film; E-MASK (registered trade name; manufactured by Nitto Denko Corporation) obtained by forming an adhesive layer on a surface of a polyethylene terephthalate resin film; and MASTAC (registered trade name; manufactured by Fujimori Kogyo Co., Ltd.) obtained by forming an adhesive layer on a surface of a polyethylene terephthalate resin film.

In addition, a method of attaching the film with a pressure sensitive adhesive layer is not particularly limited. For example, the attachment can be performed using a device for attaching a surface protective tape or a laminator which is well-known in the related art.

The interval between the respective conductive paths in the anodic oxidation film is preferably 5 nm to 800 nm, more preferably 10 nm to 200 nm, and still more preferably 50 nm to 140 nm. In a case where the interval between the respective conductive paths in the anodic oxidation film is in the above-described range, the anodic oxidation film sufficiently functions an insulating partition wall.

Here, the interval between the respective conductive paths refers to a width w between conductive paths adjacent to each other and refers to an average value that is obtained by observing a cross-section of the structure using a field emission scanning electron microscope at a magnification of 200,000-power, measuring widths between conductive paths adjacent to each other at 10 points, and obtaining the average of the measured widths.

<Conductive Path>

The plurality of conductive paths are formed of a conductive material.

<Conductive Material>

The conductive material forming the conductive path is not particularly limited as long as it is a material having an electrical resistivity of $10^3$ Ω·cm or lower, and preferable specific examples thereof include gold (Au), silver (Ag), copper (Cu), aluminum (Al), magnesium (Mg), nickel (Ni), and tin oxide doped with indium (ITO).

Among these, from the viewpoint of electrical conductivity, copper, gold, aluminum, or nickel is preferable and copper or gold is more preferable.

<Protrusion Portion>

From the viewpoint that, in a case where the structure and an electrode are electrically or physically connected to each other using a method such as pressure bonding and the protrusion portion is collapsed, the insulating characteristics in a plane direction can be sufficiently secured, an aspect ratio (the height of the protrusion portion/the diameter of the protrusion portion) of the protrusion portion of the conductive path is preferably 0.5 or higher and lower than 50, more preferably 0.8 to 20, and still more preferably 1 to 10.

In addition, from the viewpoint of conformability of a connection target to a surface shape of a semiconductor member, as described above, the height of the protrusion portion of the conductive path is preferably 20 nm or more and more preferably 100 nm to 500 nm.

The height of the protrusion portion of the conductive path refers to an average value that is obtained by observing a cross-section of the structure using a field emission scanning electron microscope at a magnification of 20000-power and measuring the height of the protrusion portion of the conductive path at 10 points, and obtaining the average of the measured heights.

The diameter of the protrusion portion of the conductive path refers to an average value that is obtained by observing a cross-section of the structure using a field emission scanning electron microscope, measuring the diameter of the protrusion portion of the conductive path at 10 points, and obtaining the average of the measured heights.

<Other Shapes>

The conductive paths have a columnar shape, and like the diameter of the protrusion portion, a diameter d of the conductive path is preferably more than 5 nm and 10 μm or less, more preferably 20 nm to 1000 nm, and still more preferably 100 nm or less.

In addition, the conductive paths are present in a state where they are electrically insulated from each other by the anodic oxidation film, and the density thereof is preferably 20000 pieces/mm² or more, more preferably 2000000 pieces/mm² or more, still more preferably 10000000 pieces/mm² or more, still more preferably 50000000 pieces/mm² or more, and most preferably 100000000 pieces/mm² or more.

Further, a distance p (refer to FIG. 13) between the centers of the respective conductive paths adjacent to each other is preferably 20 nm to 500 nm, more preferably 40 nm to 200 nm, and still more preferably 50 nm to 140 nm.

<Resin Layer>

The above-described conductive paths are buried in the resin layer. That is, the resin layer covers the surface of anodic oxidation film and the protrusion portion of the conductive path.

The resin layer imparts temporary adhesiveness to a connection target. It is preferable that the resin layer shows fluidity, for example, in a temperature range of 50° C. to 200° C. and is cured at 200° C. or higher.

Hereinafter, the composition of the resin layer will be described. The resin layer includes an antioxidation material and a polymer material.

<Antioxidation Material>

Specific examples of the antioxidation material included in the resin layer include 1,2,3,4-tetrazole, 5-amino-1,2,3,4-tetrazole, 5-amino-1,2,3,4-tetrazole, 1H-tetrazole-5-acetic acid, 1H-tetrazole-5-succinic acid, 1,2,3-triazole, 4-amino-1,2,3-triazole, 4,5-diamino-1,2,3-triazole, 4-carboxy-1H-1,2,3-triazole, 4,5-dicarboxy-1H-1,2,3-triazole, 1H-1,2,3-triazole-4-acetic acid, 4-carboxy-5-carboxymethyl-1H-1,2,3-triazole, 1,2,4-triazole, 3-amino-1,2,4-triazole, 3,5-diamino-1,2,4-triazole, 3-carboxy-1,2,4-triazole, 3,5-dicarboxy-1,2,4-triazole, 1,2,4-triazole-3-acetic acid, 1H-benzotriazole, 1H-benzotriazole-5-carboxylic acid, benzofuroxan, 2,1,3-benzothiazole, o-phenylenediamine, m-phenylenediamine, catechol, o-aminophenol, 2-mercaptobenzothiazole, 2-mercaptobenzimidazole, 2-mercaptobenzoxazole, melamine, and derivatives thereof.

Among these, benzotriazole or a derivative thereof is preferable.

Examples of the benzotriazole derivative include a substituted benzotriazole having a hydroxyl group, an alkoxy group (for example, a methoxy group or an ethoxy group), an amino group, a nitro group, an alkyl group (for example, a methyl group, an ethyl group, or a butyl group), or a halogen atom (for example, fluorine, chlorine, bromine, or iodine) in a benzene ring of benzotriazole. In addition, naphthalene triazole, naphthalene bistriazole, a substituted naphthalene triazole that is substituted as described above, or a substituted naphthalene bistriazole that is substituted as described above can also be used.

In addition, other examples of the antioxidation material included in the resin layer include general antioxidants such as higher fatty acid, higher fatty acid copper, a phenol compound, alkanolamine, hydroquinones, a copper chelating agent, an organic amine, and an organic ammonium salt.

The content of the antioxidation material included in the resin layer is not particularly limited and, from the viewpoint of an anticorrosive effect, is preferably 0.0001 mass % or higher and more preferably 0.001 mass % or higher with respect to the total mass of the resin layer. In addition, from the viewpoint of obtaining an appropriate electrical resistance in the main bonding process, the content of the antioxidation material is preferably 5.0 mass % or lower and more preferably 2.5 mass % or lower.

<Polymer Material>

The polymer material included in the resin layer is not particularly limited and is preferably a thermosetting resin from the viewpoint that it can efficiently fill a gap between a bonding target such as a semiconductor chip or a semiconductor wafer and the structure and can further improve adhesiveness between the structure and a semiconductor chip or a semiconductor wafer.

Specific examples of the thermosetting resin include an epoxy resin, a phenolic resin, a polyimide resin, a polyester resin, a polyurethane resin, a bismaleimide resin, a melamine resin, and an isocyanate resin.

Among these, from the viewpoint of further improving insulating reliability and obtaining excellent chemical resistance, it is preferable that a polyimide resin and/or an epoxy resin is used.

<Migration Inhibiting Material>

It is preferable that the resin layer includes a migration inhibiting material from the viewpoint that the migration inhibiting material can further improve insulating reliability by trapping a metal ion or a halogen ion that may be included in the resin layer and a metal ion derived from a semiconductor chip or a semiconductor wafer.

As the migration inhibiting material, for example, an ion exchanger, specifically, a mixture of a cation exchanger and an anion exchanger or only a cation exchanger can be used.

Here, each of the cation exchanger and the anion exchanger can be appropriately selected from an inorganic ion exchanger and an organic ion exchanger described below.

(Inorganic Ion Exchanger)

Examples of the inorganic ion exchanger include a metal hydrous oxide such as hydrous zirconium oxide.

As the kind of the metal, for example, in addition to zirconium, iron, aluminum, tin, titanium, antimony, magnesium, beryllium, indium, chromium, bismuth, or the like is known.

Among these, hydrous zirconium oxide has exchange capacity for $Cu^{2+}$ and $Al^{3+}$ as a cation. In addition, hydrous iron oxide has exchange capacity for $Ag^+$ and $Cu^{2+}$. Likewise, hydrous tin oxide, hydrous titanium oxide, and hydrous antimony oxide are cation exchangers.

On the other hand, hydrous bismuth oxide has exchange capacity for as an anion.

In addition, hydrous zirconium oxide has exchange capacity for an anion depending on manufacturing conditions. The same can be applied to hydrous aluminum oxide and hydrous tin oxide.

As an inorganic ion exchanger other than the above-described examples, a polyvalent metal acid salt such as zirconium phosphate or a heteropolyacid salt such as ammonium molybdophosphate, or a synthetic product such as insoluble ferrocyanide is known.

Some of the inorganic ion exchangers are already commercially available. For example, various grades of trade name "IXE" (manufactured by Toagosei Co., Ltd.) are known.

In addition to the synthetic products, natural zeolite or inorganic ion exchanger powder such as montmorillonite can be used.

(Organic Ion Exchanger)

Examples of a cation exchanger as the organic ion exchanger include a crosslinked polystyrene having a sulfonate group, a carboxylate group, a phosphonate group, or a phosphinate group.

In addition, examples of an anion exchanger as the organic ion exchanger include a crosslinked polystyrene having a quaternary ammonium group, a quaternary phosphonium group, or a tertiary sulfonium group.

The inorganic ion exchanger or the organic ion exchanger may be appropriately selected in consideration of a cation or an anion to be trapped and the exchange capacity of the ion. Of course, a mixture of the inorganic ion exchanger and the organic ion exchanger may also be used.

Steps of manufacturing an electronic element include a heating process, the inorganic ion exchanger is preferable.

In addition, regarding a mixing ratio between the ion exchanger and the polymer material, for example, from the viewpoint of mechanical strength, the content of the ion exchanger is preferably 10 mass % or lower, more preferably 5 mass % or lower, and still more preferably 2.5 mass % or lower. In addition, from the viewpoint of suppressing migration in a case where a semiconductor chip or a semiconductor wafer and the structure are bonded to each other, the content of the ion exchanger is preferably 0.01 mass % or higher.

<Inorganic Filler>

It is preferable that the resin layer includes an inorganic filler.

The inorganic filler is not particularly limited and can be appropriately selected from well-known inorganic fillers. Examples of the inorganic filler include kaolin, barium sulfate, barium titanate, silicon oxide powder, pulverized silicon oxide, gas-phase silica, amorphous silica, crystalline silica, fused silica, spherical silica, talc, clay, magnesium carbonate, calcium carbonate, aluminum oxide, aluminum hydroxide, mica, aluminum nitride, zirconium oxide, yttrium oxide, silicon carbide, and silicon nitride.

From the viewpoint of preventing the inorganic filler from entering a gap between the conductive paths and further improving conductivity reliability, the average particle diameter of the inorganic filler is preferably more than the interval between the respective conductive paths.

The average particle diameter of the inorganic filler is preferably 30 nm to 10 μm and more preferably 80 nm to 1 μm.

Here, the average particle diameter refers to a primary particle size measured using a laser diffraction scattering particle size distribution analyzer (MICROTRAC MT3300, manufactured by Nikkiso Co., Ltd.).

<Curing Agent>

The resin layer may include a curing agent.

In a case where the resin layer includes a curing agent, it is more preferable that the resin layer includes a curing agent that is solid at normal temperature is not used and a curing agent that is liquid at normal temperature from the viewpoint of suppressing bonding failure of a connection target to a surface shape of a semiconductor chip or a semiconductor wafer.

Here, "being solid at normal temperature" represents being solid at 25° C. and refers to a material having a melting point of higher than 25° C.

Specific examples of the curing agent include an aromatic amine such as diaminodiphenylmethane or diaminodiphenylsulfone, an aliphatic amine, an imidazole derivative such as 4-methylimidazole, dicyandiamide, tetramethylguanidine, thiourea-added amine, a carboxylic anhydride such as methylhexahydrophthalic anhydride, carboxylic acid hydrazide, carboxylic acid amide, a polyphenol compound, a novolac resin, and polymercaptan. A curing agent that is liquid at 25° C. can be appropriately selected from the above curing agents and used. The curing agents may be used alone or in combination of two or more kinds.

Within a range where the properties do not deteriorate, the resin layer may include various additives such as a dispersant, a buffer agent, or a viscosity adjuster that are generally widely added to a resin insulating film of semiconductor package.

<Shape>

From the viewpoint of protecting the conductive paths of the structure, the thickness of the resin layer is more than the height of the protrusion portion of the conductive path and is preferably 1 μm to 5 μm.

[Bonding of Structure]

Hereinafter, the bonding of the structure 18 manufactured as described above will be described.

Figure 15:
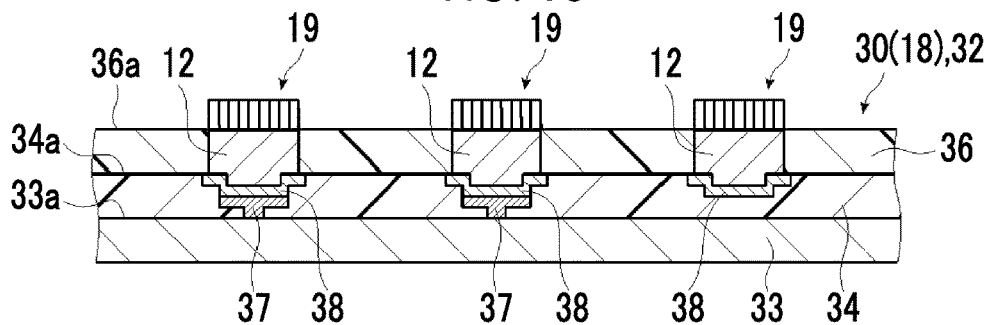
FIG. 15 is a schematic cross-sectional view showing one example of a configuration of the structure according to the embodiment of the present invention.
Figure 16:
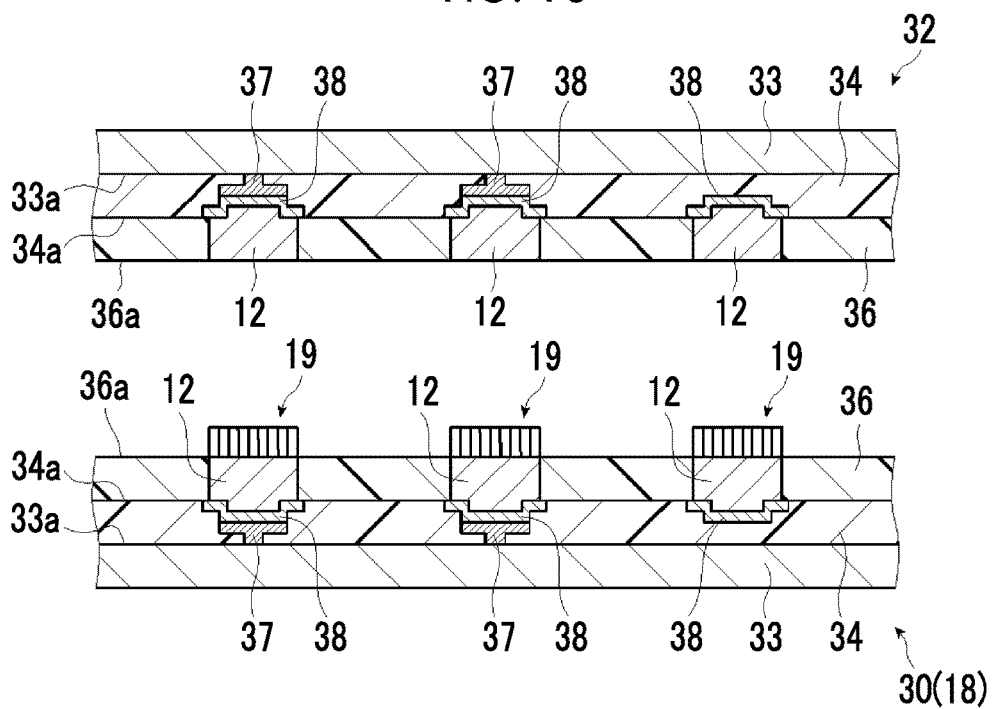
FIG. 16 is a schematic cross-sectional view showing one step of one example of a bonding method using the structure according to the embodiment of the present invention.
Figure 17:
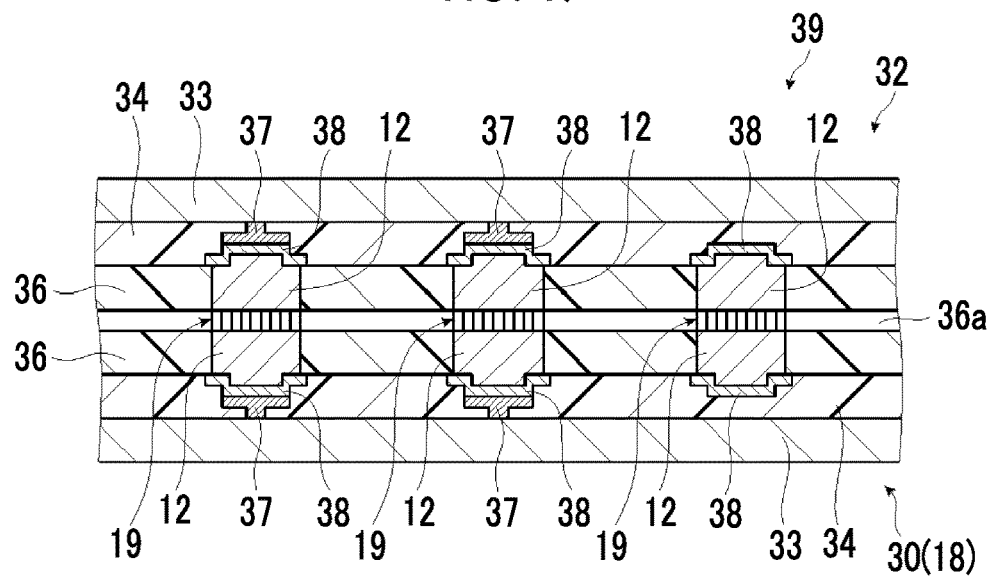
FIG. 17 is a schematic cross-sectional view showing one step of one example of the bonding method using the structure according to the embodiment of the present invention.

FIG. 15 is a schematic cross-sectional view showing one example of a configuration of the structure according to the embodiment of the present invention. FIGS. 16 and 17 are schematic cross-sectional views showing one example of a bonding method using the structure according to the embodiment of the present invention in order of steps. The bonding method shown in FIGS. 16 and 17 relates to chip-on-chip, and a semiconductor element 30 as the structure 18 is bonded to a semiconductor element 32. As a result, a bonded body 39 is obtained.

As shown in FIG. 15, each of the semiconductor elements 30 and 32 includes a semiconductor layer 33, a re-distribution layer 34, and a passivation layer 36. The re-distribution layer 34 and the passivation layer 36 are insulating layers that are electrically insulated from each other. On a surface 33a of the semiconductor layer 33, an element region (not shown) in which a circuit or the like that exhibits a specific function is formed is provided. The element region will be described below. The surface 33a of the semiconductor layer 33 corresponds to the surface on which terminals of the semiconductor are provided.

The re-distribution layer 34 is provided on the surface 33a of the semiconductor layer 33. In the re-distribution layer 34, a wiring line 37 that is electrically connected to the element region of the semiconductor layer 33 is provided. A pad 38 is provided in the wiring line 37, and the wiring line 37 and the pad 38 are electrically connected. Through the wiring line 37 and the pad 38, a signal can be transmitted to and received from the element region and a voltage or the like can be supplied to the element region.

On the surface 34a of the re-distribution layer 34, the passivation layer 36 is provided. In the passivation layer 36, the conductive layer 12 that functions as an extraction electrode is provided in the pad 38 provided in the wiring line 37. The conductive layer 12 is electrically connected to the semiconductor layer 33.

In addition, in the re-distribution layer 34, the wiring line 37 is not provided, and only the pad 38 is provided. The conductive layer 12 that functions as an electrode is provided in the pad 38 that is not provided in the wiring line 37. The conductive layer 12 is not electrically connected to the semiconductor layer 33.

An edge surface 12c of the conductive layer 12 and an edge surface 12c of the conductive layer 12 match a surface 36a of the passivation layer 36 and are flush with the surface 36a. The conductive layer 12 and the conductive layer 12 do not protrude from the surface 36a of the passivation layer 36. The conductive layer 12 and the conductive layer 12 shown in FIG. 15 are made to be flush with the surface 36a of the passivation layer 36, for example, by polishing. The edge surface 12c of the conductive layer 12 of the semiconductor element 30 corresponds to the surface 12a of the conductive layer 12, and the conductive member 19 is formed on the edge surface 12c of the conductive layer 12 to form the structure 18. In a case where the two semiconductor elements 30 and 32 are bonded to each other, the conductive member 19 may be formed by using any one of the semiconductor elements 30 and 32 as the structure 18. Both of the two semiconductor elements 30 that are the structures 18 may be bonded to each other. That is, the conductive members 19 may be bonded to each other.

As shown in FIG. 16, the semiconductor element 30 and the semiconductor element 32 are disposed such that the conductive layers 12 thereof face each other.

By aligning the semiconductor element 30 and the semiconductor element 32 to, for example, a position using an alignment mark (not shown), the positions of the conductive layer 12 of the semiconductor element 30 and the conductive layer 12 of the semiconductor element 32 are aligned. The alignment of the above-described positions will also be referred to as alignment.

In FIG. 16, the conductive member 19 is formed on the semiconductor element 30 positioned on the lower side.

In a state where the semiconductor element 30 and the semiconductor element 32 are aligned, the semiconductor element 30 and the semiconductor element 32 are made to approach each other as shown in FIG. 17, and the conductive member 19 of the semiconductor element 30 and the conductive layer 12 of the semiconductor element 32 are brought into contact with each other such that the semiconductor element 30 and the semiconductor element 32 are temporarily bonded to each other. Although described below, the temporary bonding is a state the alignment is maintained, not a state where the alignment is fixed permanently.

Next, as shown in FIG. 17, the semiconductor element 30 and the semiconductor element 32 are bonded to each other. As a result, the conductive layers 12 corresponding to each other are directly connected to each other through the conductive member 19. The semiconductor element 30 and the semiconductor element 32 are electrically connected to each other through the conductive member 19 and the conductive layer 12 and are physically connected to each other through the conductive member 19 and the conductive layer 12.

A step of bonding at least two members such as the semiconductor element 30 and the semiconductor element 32 will be referred to as "bonding step". In the bonding step, for example, at least two members are bonded to each other, for example, under predetermined bonding conditions.

Bonding represents that objects are bonded to each other in a state where electrical conduction is secured therebetween. In a case where the objects are bonded, bonding between the objects is maintained permanently. The bonding in the bonding step will also be referred to as "main bonding".

In the bonding step, for example, in the temporary bonding state, the objects may be bonded to each other under predetermined conditions. However, the temporary bonding may be omitted. The step of temporary bonding objects will be referred to as "temporary bonding step", and the bonding other than the temporary bonding of the bonding step will also be referred to as "main bonding".

The semiconductor layer 33 is not particularly limited as long as it is a semiconductor. The semiconductor layer 33 is formed of silicon or the like but is not limited thereto. For example, the semiconductor layer 33 may be formed of silicon carbide, germanium, gallium arsenide, or gallium nitride.

The re-distribution layer 34 is formed of an electrically insulating material such as polyimide.

In addition, the passivation layer 36 is also formed of an electrically insulating material such as silicon nitride (SiN) or polyimide.

The wiring line 37 and the pad 38 are formed of a conductive material such as copper, a copper alloy, aluminum, or an aluminum alloy.

As in the case of the wiring line 37 and the pad 38, the conductive layer 12 and the conductive layer 12 are also formed of a conductive material such as metal or an alloy. Specifically, the conductive layer 12 and the conductive layer 12 are formed of, for example, copper, a copper alloy, aluminum, or an aluminum alloy. As described above, it is preferable that the conductive layer 12 and the conductive material filled in the structure 18 are formed of the same material.

The conductive layer 12 and the conductive layer 12 are formed of any material as long as the material is conductive, and are not necessarily formed of metal or an alloy. A material used for a component called a terminal or an electrode pad in the semiconductor element field can be appropriately used.

[Stacked Device]

Next, a stacked device will be described as an example including the structure 18.

Figure 18:
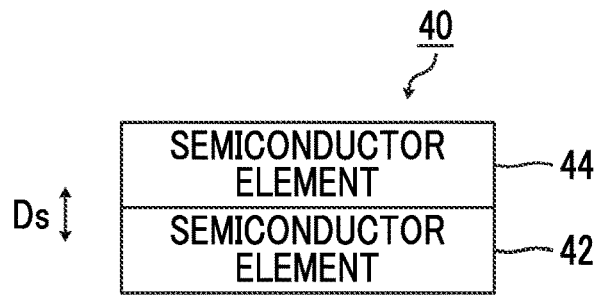
FIG. 18 is a schematic diagram showing a first example of a stacked device including the structure according to the embodiment of the present invention.
Figure 19:
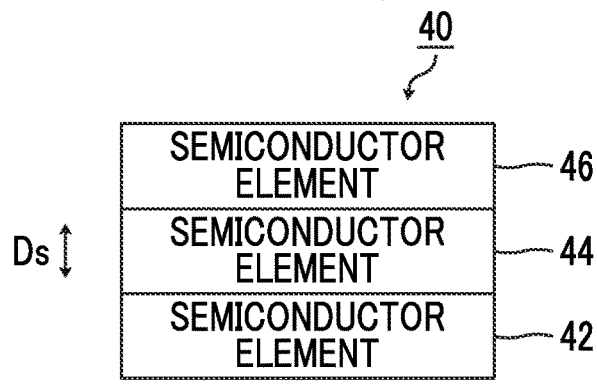
FIG. 19 is a schematic diagram showing a second example of the stacked device including the structure according to the embodiment of the present invention.
Figure 20:
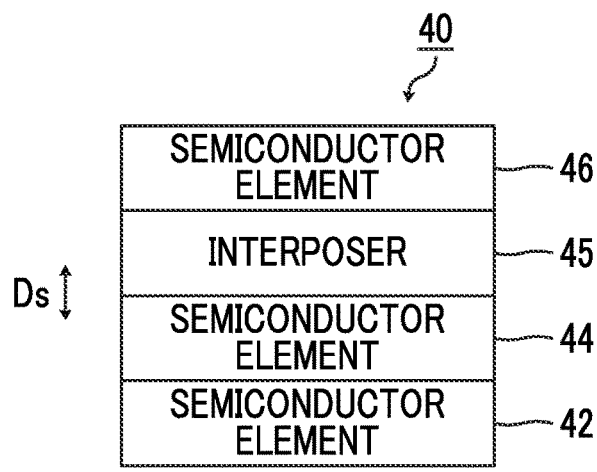
FIG. 20 is a schematic diagram showing a third example of the stacked device including the structure according to the embodiment of the present invention.
Figure 21:
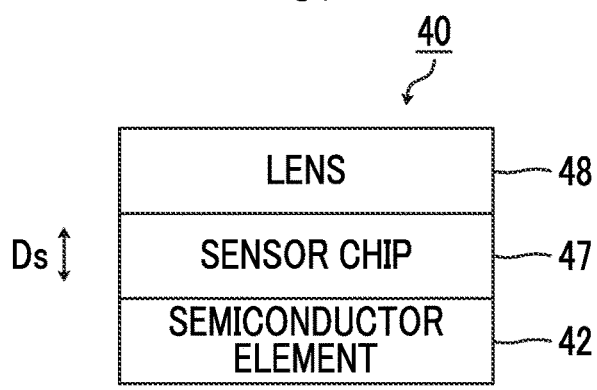
FIG. 21 is a schematic diagram showing a fourth example of the stacked device including the structure according to the embodiment of the present invention.

FIG. 18 is a schematic diagram showing a first example of a stacked device including the structure according to the embodiment of the present invention. FIG. 19 is a schematic diagram showing a second example of the stacked device including the structure according to the embodiment of the present invention. FIG. 20 is a schematic diagram showing a third example of the stacked device including the structure according to the embodiment of the present invention. FIG. 21 is a schematic diagram showing a fourth example of the stacked device including the structure according to the embodiment of the present invention.

In a stacked device 40 shown in FIG. 18, any one of a semiconductor element 42 or a semiconductor element 44 is used as the structure 18. In the stacked device 40, the semiconductor element 42 and the semiconductor element 44 are bonded to each other through the conductive member 19 (not shown) in a stacking direction Ds such that the semiconductor element 42 and the semiconductor element 44 are electrically connected to each other.

The conductive member 19 of the structure 18 includes the conductive path 16 (refer to FIG. 14) that extends in the stacking direction Ds and implements a through silicon via (TSV) function.

In addition to the configuration shown in FIG. 18, for example, as in the stacked device 40 shown in FIG. 19, the semiconductor element 42, the semiconductor element 44, and a semiconductor element 46 may be stacked and bonded in the stacking direction Ds such that they are electrically connected to each other.

In addition to the structure 18, for example, as in the stacked device 40 shown in FIG. 20, the semiconductor element 42, the semiconductor element 44, and the semiconductor element 46 may be stacked and bonded using an interposer 45 in the stacking direction Ds such that they are electrically connected to each other.

The interposer 45 functions for electrical connection between the semiconductor elements. In addition, the interposer 45 also functions for electrical connection between the semiconductor elements and a wiring board or the like. By using the interposer 45, the wiring length and the wiring width can be reduced, the parasitic capacitance can be reduced, and a variation in wiring length or the like can be reduced.

As long as the above-described functions can be implemented, the configuration of the interposer 45 is not particularly limited and can appropriately include well-known components. The interposer 45 can be configured using an organic material such as polyimide, glass, a ceramic, metal, silicon, or polycrystalline silicon.

In addition, as in the stacked device 40 shown in FIG. 21, the stacked device according to the embodiment may function as an optical sensor. In the stacked device 40 shown in FIG. 21, the semiconductor element 42 and a sensor chip 47 are stacked in the stacking direction Ds. In the stacked device 40, the semiconductor element 42 and the sensor chip 47 are bonded to each other using the structure 18. In addition, a lens 48 is provided on the sensor chip 47.

In the semiconductor element 42, a logic circuit is formed, and a configuration thereof is not particularly limited as long as a signal obtained from the sensor chip 47 can be processed.

The sensor chip 47 includes an optical sensor that detects light. The optical sensor is not particularly limited as long as it can detect light. For example, a charge coupled device (CCD) image sensor or a complementary metal oxide semiconductor (CMOS) image sensor is used.

The configuration of the lens 48 is not particularly limited as long as light can be collected on the sensor chip 47. For example, a lens called a microlens is used.

Each of the semiconductor element 42, the semiconductor element 44, and the semiconductor element 46 includes the element region (not shown). The element region is as described above. As described above, the element component circuits and the like are formed in the element region, and, for example, the re-distribution layer (not shown) is provided in the semiconductor element.

The stacked device includes, for example, a combination of a semiconductor element including a logical circuit and a semiconductor element including a memory circuit. In addition, all the semiconductor elements may include a memory circuit, or all the semiconductor elements may include a logical circuit. In addition, the combination of the semiconductor elements in the stacked device 40 may be a sensor, an actuator, an antenna, or the like, a memory circuit, and a logical circuit, and is appropriately determined according to the use or the like of the stacked device 40.

[Semiconductor Element]

In addition to the above-described examples, examples of the semiconductor element 42, the semiconductor element 44, and the semiconductor element 46 include a logic large scale integration (LSI) (for example, an application specific integrated circuit (ASIC), a field programmable gate array (FPGA), or an application specific standard product (ASSP)), a microprocessor (for example, a central processing unit (CPU) or a graphics processing unit (GPU)), a memory (for example, a dynamic random access memory (DRAM), a hybrid memory cube (HMC), a magnetic RAM (MRAM), a phase-change memory (PCM), a resistive RAM (ReRAM), a ferroelectric RAM (FeRAM), or a flash memory (NAND (Not AND) flash)), a light emitting diode (LED) (for example, a microflash of portable terminal, a vehicle-mounted LED, a projector light source, a LCD backlight, or a general lighting device), a power device, an analog integrated circuit (IC) (for example, a direct current (DC)-direct current (DC) converter or an insulated gate bipolar transistor (IGBT)), micro electromechanical systems (MEMS) (for example, an acceleration sensor, a pressure sensor, an oscillator, or a gyro sensor), a wireless device (for example, a global positioning system (GPS), a frequency modulation (FM), a near field communication (NFC), a RF expansion module (RFEM), a monolithic microwave integrated circuit (MMIC), or a wireless local area network (WLAN)), a discrete element, a back side illumination (BSI), a contact image sensor (CIS), a camera module, a complementary metal oxide semiconductor (CMOS), a passive device, a surface acoustic wave (SAW) filter, a radio frequency (RF) filter, a radio frequency integrated passive device (RFIPD), and a broadband (BB).

The semiconductor element is, for example, a completed product by itself, and the semiconductor element alone exhibits a specific function such as a circuit or a sensor.

The stacked device is not limited to the one-to-plurality configuration in which a plurality of semiconductor elements are bonded to one semiconductor element but the embodiment is not limited thereto. The stacked device may have a plurality-to-plurality configuration in which a plurality of semiconductor elements are bonded to a plurality of semiconductor elements.

First Example of Method of Manufacturing Stacked Device

Next, a first example of a method of manufacturing the stacked device including the structure will be described.

The first example of the method of manufacturing the stacked device including the structure relates to a chip-on wafer and is a method of manufacturing the stacked device 40 shown in FIG. 18.

Figure 22:
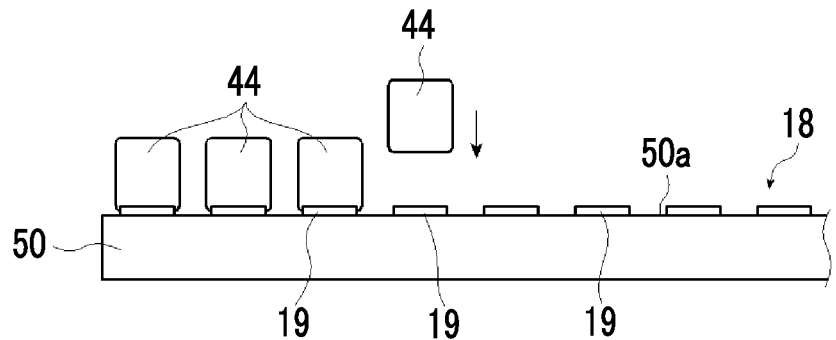
FIG. 22 is a schematic diagram showing one step of a first example of a method of manufacturing the stacked device including the structure according to the embodiment of the present invention.
Figure 24:
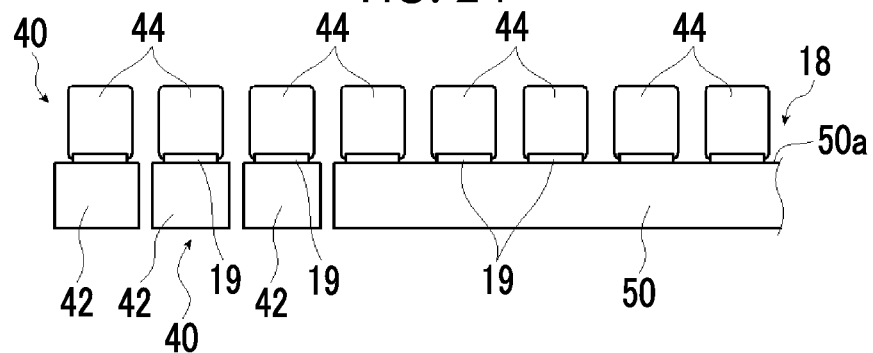
FIG. 24 is a schematic diagram showing one step of a first example of a method of manufacturing the stacked device including the structure according to the embodiment of the present invention.

FIGS. 22 and 24 are schematic diagrams showing the first example of the method of manufacturing the stacked device including the structure according to the embodiment of the present invention in the order of steps.

In the first example of the method of manufacturing the stacked device including the structure, the structure 18 is manufactured in a first semiconductor wafer 50. On a surface 50a of the first semiconductor wafer 50, a plurality of element regions (not shown) are provided, and the conductive member 19 is provided in each of the element regions.

Next, the semiconductor element 44 is disposed to face the conductive member 19 of the first semiconductor wafer 50. Next, using the alignment mark of the semiconductor element 44 and the alignment mark of the first semiconductor wafer 50, the semiconductor element 44 is aligned with respect to the first semiconductor wafer 50.

The configuration of the alignment is not particularly limited as long as digital image data can be obtained for an image or a reflected image of the alignment mark of the first semiconductor wafer 50 and an image or a reflected image of the alignment mark of the semiconductor element 44. For example, a well-known imaging apparatus can be appropriately used.

Figure 23:
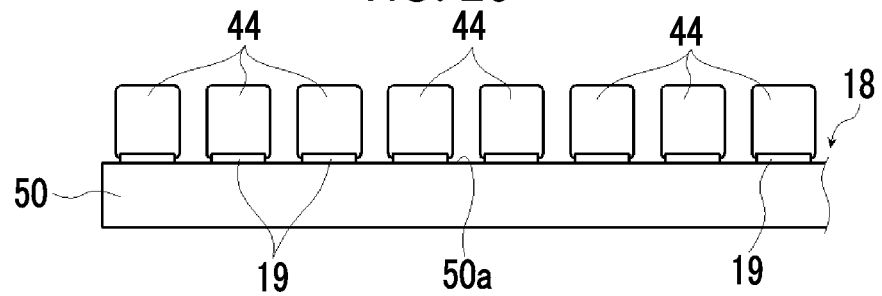
FIG. 23 is a schematic diagram showing one step of the first example of the method of manufacturing the stacked device including the structure according to the embodiment of the present invention.

Next, the semiconductor element 44 is placed on the conductive member 19 provided in the element region of the first semiconductor wafer 50, is applied with, for example, a predetermined pressure, is heated to a predetermined temperature, is held at the temperature for a predetermined time, and is temporarily bonded, for example, using the resin layer 17 (refer to FIG. 14). By performing this process on all the semiconductor elements 44, all the semiconductor elements 44 are temporarily bonded to the element regions of the first semiconductor wafer 50 as shown in FIG. 23.

The use of the resin layer 17 for the temporary bonding is one method, and a method described below may also be used for the temporary bonding. For example, the semiconductor element 44 may be temporarily bonded to the element regions of the first semiconductor wafer 50 by supplying a sealing resin or the like to the conductive member 19 of the first semiconductor wafer 50 using a dispenser or the like, or the semiconductor element 44 may be temporarily bonded to the element region using an insulating resin film (non-conductive film (NCF)) supplied to the first semiconductor wafer 50 in advance.

Next, in a state where all the semiconductor elements 44 are temporarily bonded to the element regions of the first semiconductor wafer 50, a predetermined pressure is applied to the semiconductor elements 44, the semiconductor elements 44 are heated at a predetermined temperature, and the semiconductor elements 44 are held at the temperature for a predetermined time such that all the plurality of semiconductor elements 44 are collectively bonded to the element regions of the first semiconductor wafer 50 through the conductive members 19. This bonding is called main bonding. As a result, terminal (not shown) of the semiconductor elements 44 are bonded to the conductive member 19 of the first semiconductor wafer 50.

Next, as shown in FIG. 24, the first semiconductor wafer 50 to which the semiconductor elements 44 are bonded is singulated per element region, for example, by dicing or laser scribing. As a result, the stacked device 40 in which the semiconductor element 42 and the semiconductor element 44 are bonded to each other can be obtained.

In a case where the temporary bonding strength is weak during the temporary bonding, misalignment occurs in a transport step and a step before bonding. Therefore, the temporary bonding strength is important.

In addition, temperature conditions and pressurization conditions in the temporary bonding step are not particularly limited. For example, temperature conditions and pressurization conditions described below may be adopted.

In addition, temperature conditions and pressurization conditions in the main bonding are not particularly limited. For example, temperature conditions and pressurization conditions described below may be adopted.

By performing the main bonding under appropriate conditions, the resin layer flows through the electrodes of the semiconductor element 44 and is not likely to remain in the bonding portion. As described above, by collectively performing the bonding of the plurality of semiconductor elements 44 in the main bonding, the tact time can be reduced, and the productivity can be improved.

Second Example of Method of Manufacturing Stacked Device

A second example of the method of manufacturing the stacked device including the structure will be described.

Figure 25:
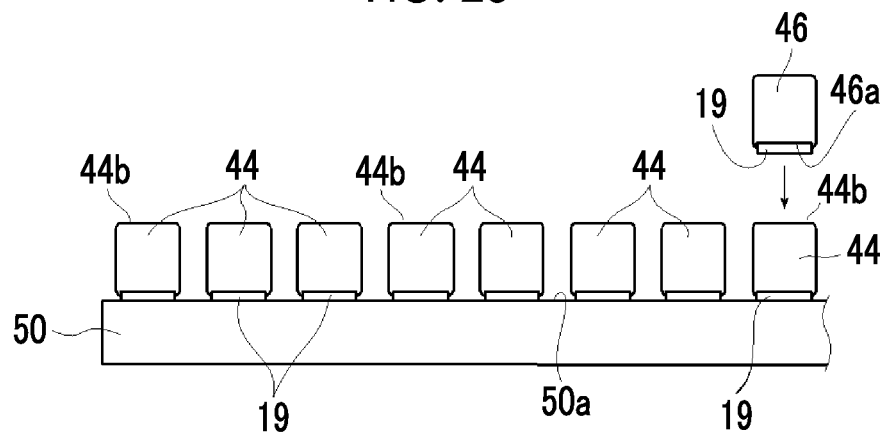
FIG. 25 is a schematic diagram showing one step of a second example of the method of manufacturing the stacked device including the structure according to the embodiment of the present invention.

FIG. 25 is a schematic diagram showing one step of the second example of the method of manufacturing the stacked device including the structure according to the embodiment of the present invention.

The second example of the method of manufacturing the stacked device including the structure is the same as the first example of the method of manufacturing the stacked device including the structure, except that the three semiconductor elements 42, 44, and 46 are stacked and bonded. Therefore, the detailed description of the method common to the second example of the method of manufacturing the stacked device will not be repeated.

In the semiconductor element 44, the alignment mark (not shown) is provided on a back surface 44b, and the terminals (not shown) are provided. In addition, the semiconductor element 46 is formed of the structure 18, and the conductive member 19 is provided on a surface 46a. The semiconductor element 46 is a singulated piece in which the structure 18 is manufactured in the element region (not shown) as in the first semiconductor wafer 50. Therefore, the semiconductor element 46 includes the conductive member 19.

As shown in FIG. 25, in a state where all the semiconductor elements 44 are temporarily bonded to the element regions of the first semiconductor wafer 50 through the conductive members 19, the semiconductor element 46 is aligned with respect to the semiconductor element 44 using the alignment mark of the back surface 44b of the semiconductor element 44 and the alignment mark of the semiconductor element 46.

Next, the semiconductor elements 46 are temporarily bonded to the back surfaces 44b of the semiconductor elements 44 through the conductive members 19. Next, in a state where all the semiconductor elements 44 are temporarily bonded to the element regions of the first semiconductor wafer 50 through the conductive members 19 and the semiconductor elements 46 are temporarily bonded to the all the semiconductor elements 44 through the conductive members 19, main bonding is performed under predetermined conditions. As a result, the semiconductor elements 44 and the semiconductor elements 46 are bonded to each other, and the semiconductor elements 44 and the first semiconductor wafer 50 are bonded to each other.

Next, in a state where the semiconductor elements 44 and the semiconductor elements 46 are bonded to the first semiconductor wafer 50, the semiconductor elements 44 and the semiconductor elements 46 are singulated per element region, for example, by dicing or laser scribing. As a result, the stacked device 40 (refer to FIG. 19) in which the semiconductor element 42, the semiconductor element 44, and the semiconductor element 46 are bonded to each other can be obtained.

Third Example of Method of Manufacturing Stacked Device

A third example of the method of manufacturing the stacked device including the structure will be described.

The third example of the method of manufacturing the stacked device including the structure relates to a wafer-on wafer and is a method of manufacturing the stacked device 40 shown in FIG. 18.

Figure 26:
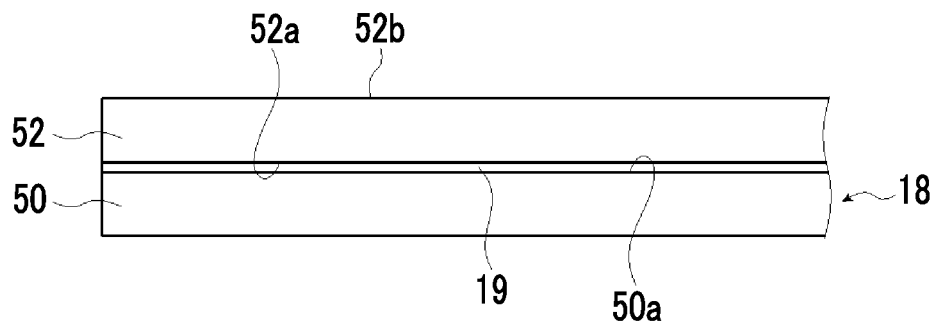
FIG. 26 is a schematic diagram showing one step of a third example of the method of manufacturing the stacked device including the structure according to the embodiment of the present invention.
Figure 27:
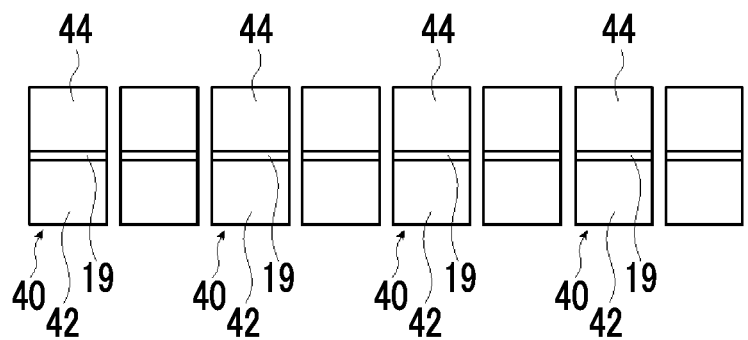
FIG. 27 is a schematic diagram showing one step of the third example of the method of manufacturing the stacked device including the structure according to the embodiment of the present invention.

FIGS. 26 and 27 are schematic diagrams showing the third example of the method of manufacturing the stacked device including the structure according to the embodiment of the present invention in the order of steps.

The third example of the method of manufacturing the stacked device is the same as the first example of the method of manufacturing the stacked device including the structure, except that the first semiconductor wafer 50 and a second semiconductor wafer 52 are bonded using the structure 18. Therefore, the detailed description of the method common to the first example of the method of manufacturing the stacked device will not be repeated. In addition, since the details of the structure 18 are as described above, the detailed description thereof will not be repeated.

First, the first semiconductor wafer 50 and the second semiconductor wafer 52 are prepared. As any one of the first semiconductor wafer 50 or the second semiconductor wafer 52, the structure 18 is used.

Next, the surface 50a of the first semiconductor wafer 50 and the surface 52a of the second semiconductor wafer 52 are arranged to face each other. Using the alignment mark of the first semiconductor wafer 50 and the alignment mark of the second semiconductor wafer 52, the second semiconductor wafer 52 is aligned with respect to the first semiconductor wafer 50.

Next, as shown in FIG. 26, the surface 50a of the first semiconductor wafer 50 and the surface 52a of the second semiconductor wafer 52 are arranged to face each other, and the first semiconductor wafer 50 and the second semiconductor wafer 52 are bonded to each other through the conductive member 19 using the above-described method. In this case, main bonding may be performed after temporary bonding, or only main bonding may be performed.

Next, as shown in FIG. 27, in a state where the first semiconductor wafer 50 and the second semiconductor wafer 52 are bonded to each other through the conductive member 19, the first semiconductor wafer 50 and the second semiconductor wafer 52 are singulated per element region, for example, by dicing or laser scribing. As a result, the stacked device 40 in which the semiconductor element 42 and the semiconductor element 44 are bonded to each other can be obtained. This way, even in a case where a wafer-on wafer is used, the stacked device 40 can be obtained.

Since the details of the singulation are as described above, the detailed description thereof will not be repeated.

In addition, in a state where the first semiconductor wafer 50 and the second semiconductor wafer 52 are bonded to each other as shown in FIG. 27, in a case where it is necessary to reduce the thickness of one semiconductor wafer among the first semiconductor wafer 50 and the second semiconductor wafer 52, the thickness of this semiconductor wafer can be reduced by chemical mechanical polishing (CMP).

In the third example of the method of manufacturing the stacked device including the structure, the two-layer structure in which the semiconductor element 42 and the semiconductor element 44 are stacked has been described, but the embodiment is not limited thereto. Of course, the stacked structure may include three or more layers as described above. In this case, as in the second example of the method of manufacturing the stacked device 40, the alignment mark (not shown), the terminals are provided on a back surface 52b of the second semiconductor wafer 52 such that the stacked device 40 including three or more layers can be obtained.

As described above, in the stacked device 40, by using the structure 18, even in a case where a semiconductor element has unevenness, the protrusion portions 16a can function as a buffer layer to absorb the unevenness. Since the protrusion portions 16a function as a buffer layer, high surface quality is not required for a surface of a semiconductor element where an element region is provided. Therefore, a smoothing treatment such as polishing is not required, the production cost can be reduced, and the production time can also be reduced.

In addition, the stacked device 40 can be manufactured using a chip-on wafer. Therefore, by bonding only semiconductor chips as non-defective products to non-defective portions in the semiconductor wafer, the yield can be maintained, and manufacturing loss can be reduced.

Further, as described above, the resin layer 17 has viscosity and can be used as a temporary bonding agent during temporary bonding. By using the resin layer 17, main bonding can be collectively performed.

The semiconductor element 44 can be formed using the semiconductor wafer including a plurality of element regions (not shown). In the element region, as described above, the alignment mark (not shown) for the alignment and the terminals (not shown) are provided.

Regarding the bonding of the stacked device, the configuration in which one semiconductor element is bonded to another semiconductor element has been described, but the embodiment is not limited thereto. A one-to-plurality configuration in which a plurality of semiconductor elements are bonded to one semiconductor element may be adopted. In addition, a plurality-to-plurality configuration in which a plurality of semiconductor elements are bonded to a plurality of semiconductor element may be adopted.

Hereinafter, the method of manufacturing the stacked device will be described more specifically.

[Temporary Bonding Step]

The temporary bonding in the temporary bonding step represents that objects bonded to each other are fixed in a state where the bonded objects are aligned. The temporary bonding is a state the alignment is maintained, not a state where the alignment is fixed permanently. In a case where a semiconductor element as a bonding target is temporarily fixed, the semiconductor element is fixed in a state where it is aligned.

The temporary bonding step is performed by making at least two members to approach and come into contact with each other. In this case, a pressurization condition is not particularly limited and is preferably 10 MPa or lower, more preferably 5 MPa or lower, and still more preferably 1 MPa or lower.

In addition, a temperature condition in the temporary bonding step is not particularly limited and is preferably 0° C. to 300° C., more preferably 10° C. to 200° C., and still more preferably normal temperature (23° C.) to 100° C.

In the temporary bonding step, devices manufactured by various companies such as Toray Engineering Co., Ltd., Shibutani Industry Co., Ltd., Shinkawa Ltd., and Yamaha Motor Co., Ltd. can be used.

[Bonding Step]

As described above, the bonding in the bonding step will also be referred to as "main bonding". As described above, in a case where objects are bonded, bonding between the objects is maintained permanently. Examples of control factors during the main bonding include an atmosphere during main bonding, a heating temperature, a pressure (load), and a treatment time, and conditions suitable for a device such as a semiconductor element to be used can be selected.

A temperature condition in the main bonding is not particularly limited, is preferably higher than the temperature in the temporary bonding, and specifically is more preferably 150° C. to 350° C. and still more preferably 200° C. to 300° C.

In addition, a pressurization condition in the main bonding is not particularly limited and is preferably 30 MPa or lower and more preferably 0.1 MPa to 20 MPa. The maximum load of the pressurization condition is preferably 1 MN or lower and more preferably 0.1 MN or lower.

In addition, the time in the main bonding is not particularly limited and is preferably 1 second to 60 minutes and more preferably 5 seconds to 10 minutes.

In addition, as a device used for the main bonding, for example, various wafer bonding devices manufactured by Mitsubishi Heavy Industries Machine Tools Co., Ltd., Bondtech Co., Ltd., PMT Corporation, Ayumi Industry Co., Ltd., Tokyo Electron Ltd. (TEL), EVG, SUSS Microtec SE. (SUSS), Musashino Engineering Co., Ltd. can be used.

The atmosphere during the main bonding may be any gas atmosphere selected from air, an inert gas such as nitrogen or argon, a reducing gas such as hydrogen, carboxylic acid, or mixed gas of the inert gas and the reducing gas. In addition, the atmosphere during the main bonding may be a pressure reduced atmosphere including a vacuum atmosphere. Any one of the above-described atmospheres can also be implemented using a well-known method.

The heating temperature is not particularly limited to the above-described examples and can be selected from a temperature range of 100° C. to 400° C., and the temperature increase rate can also be selected according to the performance of a heating stage from 10° C./min to 10° C./sec or a heating method. The same can also be applied to cooling. In addition, heating can also be performed stepwise, and bonding can also be performed while sequentially increasing the heating temperature in stages.

The pressure (load) is not particularly limited to the above-described examples and can be selected to be increased rapidly or stepwise depending on physical properties such as the strength of the bonding target.

During the main bonding, the atmosphere, the holding time of heating or pressurization, and the change time can be appropriately set. In addition, the order of bonding can be appropriately set. For example, the order may be as follows. The first pressurization is performed in a vacuum state. Next, in a state where the temperature is increased by performing heating, the second pressurization is performed, and the pressure is maintained for a predetermined time. In a state where the temperature becomes a predetermined temperature or lower by performing cooling immediately after a decrease in pressure, the pressure returns to the atmospheric pressure.

Figure 28:
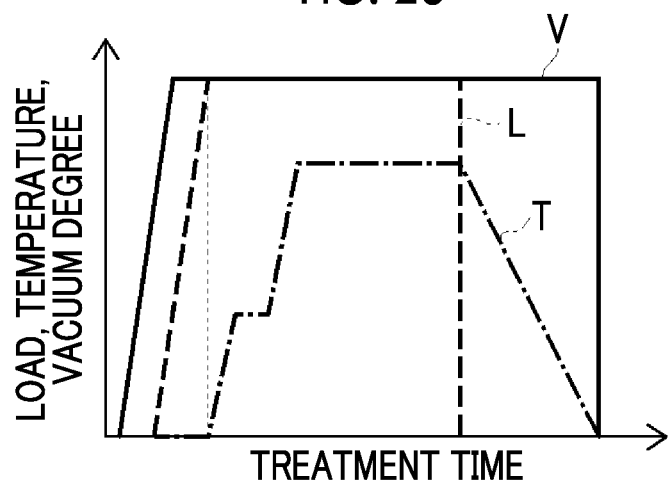
FIG. 28 is a graph showing a first example of main bonding conditions of the stacked device including the structure according to the embodiment of the present invention.
Figure 34:
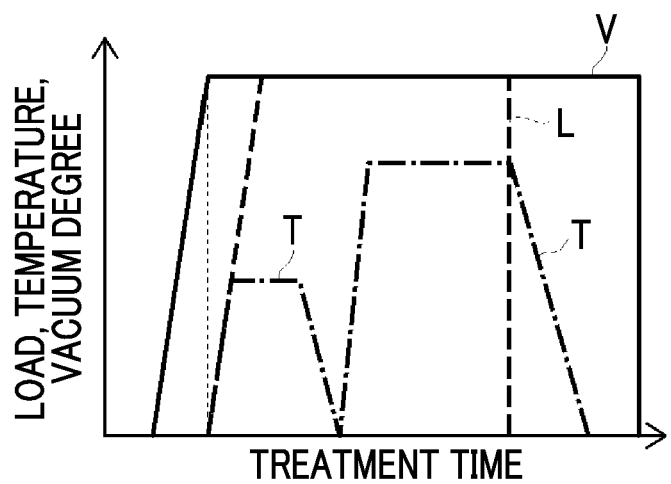
FIG. 34 is a graph showing a seventh example of the main bonding conditions of the stacked device including the structure according to the embodiment of the present invention.

The above-described order can be switched in various ways. After increasing the pressure in the air, heating may be performed in a vacuum state, or evacuation, pressurization, and heating may be performed in one go. Examples of these combinations are shown in FIGS. 28 and 34.

In addition, by using a mechanism for controlling an in-plane pressure distribution and a heating distribution individually, the yield of bonding can be improved.

The temporary bonding can also be changed as described above. For example, by performing the temporary bonding in an inert atmosphere, the oxidation of an electrode surface of a semiconductor element can be suppressed. Further, bonding can also be performed while applying ultrasonic waves.

FIGS. 28 to 34 are graphs showing first to seventh examples of the main bonding conditions of the stacked device including the structure according to the embodiment of the present invention. FIGS. 28 to 34 show the atmosphere during bonding, the heating temperature, the pressure (load), and the treatment time, and reference numeral V represents a vacuum degree, reference numeral L represents a load, and reference numeral T represents a temperature. In FIGS. 28 to 34, an increase in vacuum degree represents a decrease in pressure. In FIGS. 28 to 34, as the vacuum degree decreases, the pressure becomes closer to the atmospheric pressure.

Figure 29:
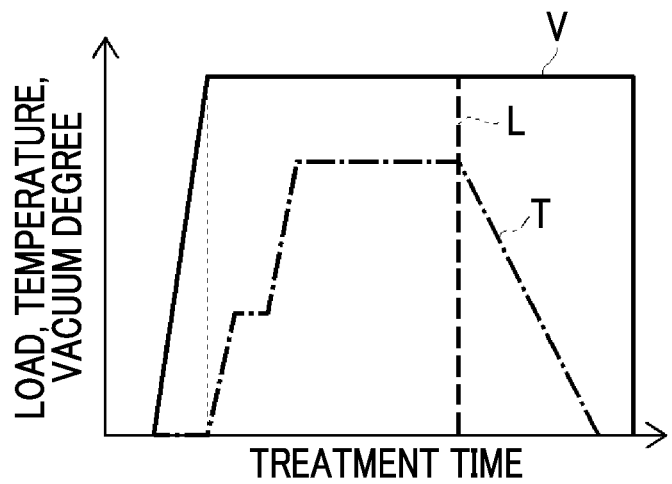
FIG. 29 is a graph showing a second example of the main bonding conditions of the stacked device including the structure according to the embodiment of the present invention.
Figure 30:
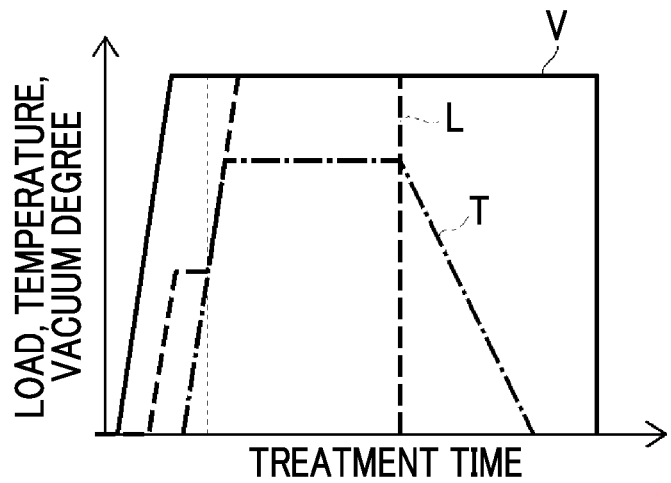
FIG. 30 is a graph showing a third example of the main bonding conditions of the stacked device including the structure according to the embodiment of the present invention.
Figure 31:
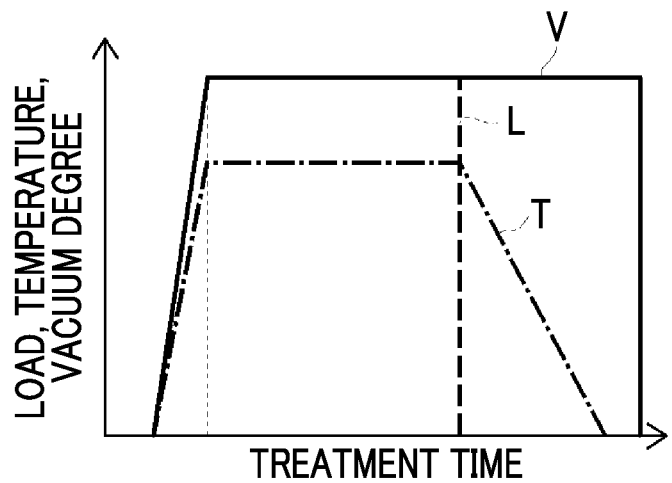
FIG. 31 is a graph showing a fourth example of the main bonding conditions of the stacked device including the structure according to the embodiment of the present invention.
Figure 32:
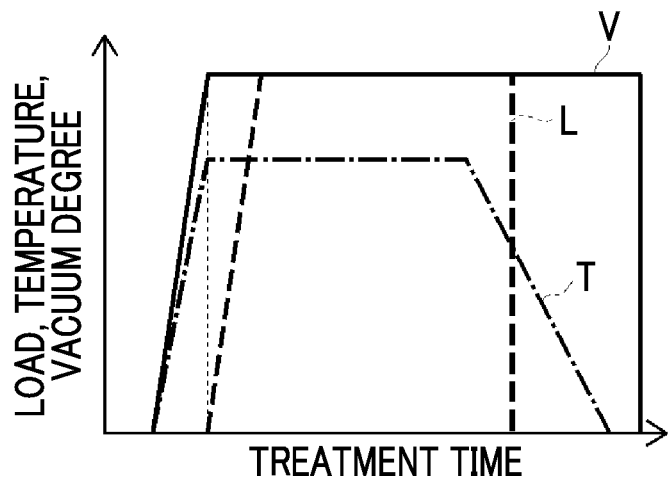
FIG. 32 is a graph showing a fifth example of the main bonding conditions of the stacked device including the structure according to the embodiment of the present invention.
Figure 33:
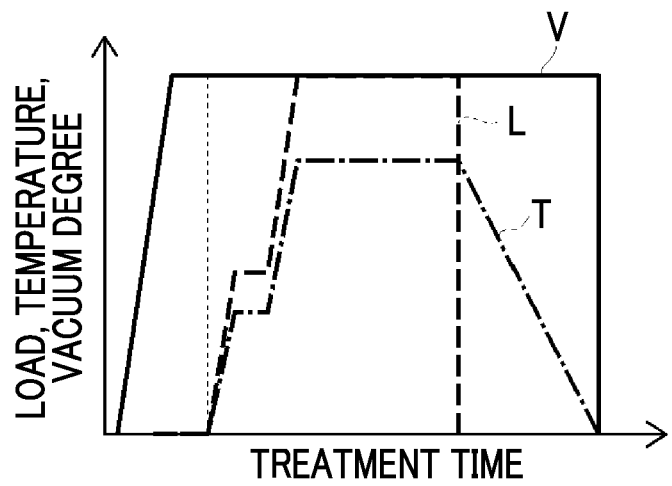
FIG. 33 is a graph showing a sixth example of the main bonding conditions of the stacked device including the structure according to the embodiment of the present invention.

Regarding the atmosphere during bonding, the heating temperature, and the load, for example, as shown in FIGS. 28 to 30, the temperature may be increased after applying a load in a state where the pressure is decreased. In addition, as shown in FIGS. 31, 33, and 34, a timing at which the load is applied and a timing at which the temperature is increased may be adjusted to be the same. As shown in FIG. 32, the load may be applied after increasing the temperature. In addition, as shown in FIGS. 31 and 32, a timing at which the pressure is decreased and a timing at which the temperature is increased may be adjusted to be the same.

The temperature may be increased stepwise as shown in FIGS. 28, 29, and 33 or may be increased in two steps as shown in FIG. 34. The load may also be applied stepwise as shown in FIGS. 30 and 33.

In addition, regarding a timing at which the pressure is decreased, the load may be applied after decreasing the pressure as shown in FIGS. 28, 30, 32, 33, and 34, and a timing at which the pressure is decreased and a timing at which the load is applied may be adjusted to be the same as shown in FIGS. 29 and 31. In this case, a decrease in pressure and bonding are performed at the same time.

[Other Bonding Steps]

The bonding method is not limited to the above-described examples. For example, the semiconductor element 42 and the semiconductor element 44 as a heat-melting material are stacked through an electrode material including at least tin. In this case, the electrode material is disposed on the protrusion portion 16a shown in FIG. 14.

Next, the heat-melting material including tin is heated and melted at a melting point or higher of the heat-melting material in an atmosphere having a pressure of $1 \times 10^4$ Pa or higher and including carboxylic acid steam such as formic acid steam. As a result, the electrode material is formed into an electrode on the protrusion portion 16a. Next, the semiconductor element 42 and the semiconductor element 44 are made to approach each other to solidify the heat-melting material, and the carboxylic acid steam is exhausted such that the pressure state is reduced from $1 \times 10^4$ Pa or higher to $1 \times 10^2$ Pa or lower. In a case where the temperature of the electrode material is 100° C. or higher and lower than the melting point, the carboxylic acid steam is exhausted. After reducing the pressure, the atmosphere is substituted with an inert gas atmosphere including carboxylic acid. As a result, as shown in FIG. 18, the stacked device 40 in which the semiconductor element 42 and the semiconductor element 44 are bonded to each other can be obtained. The carboxylic acid functions as a reducing agent such that bonding can be performed at a lower temperature. In addition, the electrode material including tin is, for example, a solder material including tin.

In addition, for example, the semiconductor element 42 and the semiconductor element 44 are stacked through a composition layer. In this case, the composition layer is disposed on the protrusion portion 16a shown in FIG. 14. In any gas atmosphere of the inert gas, the reducing gas, or the mixed gas thereof, the composition layer was heated at a temperature of 120° C. to 250° C. and is pressed. As a result, as shown in FIG. 18, the stacked device 40 in which the semiconductor element 42 and the semiconductor element 44 are bonded to each other can be obtained.

The gas atmosphere is a gas atmosphere including hydrogen gas or formic acid gas.

The composition for forming a conductor include copper-containing particles, an organic acid, and a dispersion medium. The copper-containing particles include: core particles including copper; and an organic matter that covers at least a part of surfaces of the core particles. The organic matter includes an alkylamine that has a hydrocarbon group having 7 or less carbon atoms.

The copper-containing particles are, for example, copper-containing particle described in JP2016-037627A. The copper-containing particles include at least copper and may further include, materials other than copper, a metal such as gold, silver, platinum, tin, or nickel or a compound, a reducing compound, or an organic matter including a metal element thereof.

The organic acid is, for example, an organic carboxylic acid used as a flux component for soldering. The dispersion medium is an organic solvent that is generally used for manufacturing a conductive ink, a conductive paste, or the like.

Regarding the bonding atmosphere, a well-known method such as a method of introducing any gas atmosphere selected from the vacuum atmosphere, an inert gas such as nitrogen or argon, a reducing gas such as hydrogen, carboxylic acid, or mixed gas of the inert gas and the reducing gas may be used. In particular, it is preferable to use gas including the reducing gas. As the technique of using these gases, a technique relating to solder fusion bonding or a bonding technique using fine metal particles is applicable, and the reducing atmosphere gas including a carboxylic acid such as formic acid or the reducing atmosphere gas including hydrogen is introduced into a chamber such that thermal pressure bonding can be performed. The concentration of the carboxylic acid in the atmosphere gas is desirably an explosion limit or lower and 0.002% or higher. The concentration of the gas including hydrogen is also desirably an explosion limit or lower and 1% or higher. Due to the bonding in the reducing atmosphere, the desorption of the organic matter and the removal of the oxide film on a copper pillar surface that protrudes from the surface of the anisotropic conductive member manufactured in the present invention can be easily performed, and the bonding between the copper pillar and the copper electrode as the bonding target can be promoted.

Specifically, as introducing the bonding target into the chamber, the inside of the chamber is temporarily evacuated, the reducing atmosphere gas is introduced into the chamber, and the inside of the chamber is maintained at a given pressure. In this case, the gas to be introduced into the chamber is the mixed gas of carboxylic acid steam and carrier gas (for example, nitrogen), and the pressure in the chamber is adjusted to $1 \times 10^4$ Pa or higher by the introduction of the gas. In a state where the pressure in the chamber is constant, the bonding targets are heated and bonded. The bonding targets may be heated during the evacuation or may be heated after introducing the reducing gas. The pressure in the chamber in the heating step is not particularly limited. In a case where the pressure is in a reduced pressure condition, the formation of a conductor at a low temperature tends to be promoted, and a "flow" state where the introduction and the exhaust of the gas are performed at the same time may be adopted. By adopting the "flow" state, the exhaust of the desorption gas or the like progresses at the same time, and contamination of the chamber is reduced.

Hereinafter, a semiconductor package including the structure will be described.

[Semiconductor Package]

Figure 35:
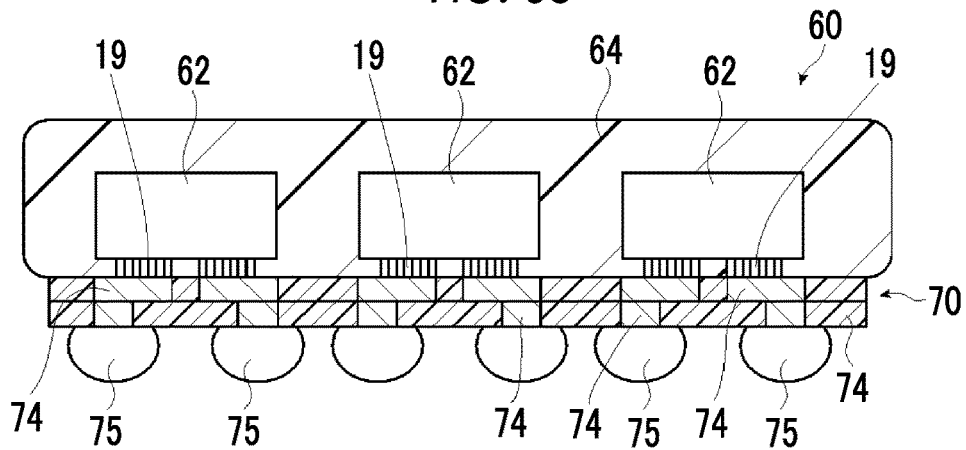
FIG. 35 is a schematic cross-sectional view showing a first example of a semiconductor package.

FIG. 35 is a schematic cross-sectional view showing a first example of a semiconductor package. In FIG. 35, the same structures in the structure 18 shown in FIGS. 13 and 14 will be represented by the same reference numerals, and the detailed description thereof will not be repeated.

In a semiconductor package 60 shown in FIG. 35, a semiconductor element 62 as the structure 18 is manufactured. The semiconductor element 62 is covered with a mold resin 64. The conductive member 19 of the semiconductor element 62 is electrically connected to a wiring board 70.

In the wiring board 70, a wiring layer 74 is provided on an insulating substrate 72 having electric insulating characteristics. One wiring layer 74 is electrically connected to the conductive path 16 (refer to FIG. 13) of the conductive member 19, and another wiring layer 74 is electrically connected to a solder ball 75. As a result, a signal or the like can be extracted from the semiconductor element 62 to the outside of the semiconductor package 60. In addition, a signal, a voltage, a current, or the like can be supplied from the outside of the semiconductor package 60 to the semiconductor element 62.

The present invention is not limited to the above-described embodiment, and examples of the embodiment include a system on a chip (SoC), a system in package (SiP), a package on package (PoP), a package in package (PiP), a chip scale package (CSP), and a through silicon via (TSV).

[Semiconductor Element Mounting Step]

In a case where the structure is mounted on a semiconductor element, mounting by heating is performed. During mounting by thermal pressure bonding including solder reflowing and mounting by flip-chip, from the viewpoint of performing uniform and reliable mounting, the maximum temperature is preferably 220° C. to 350° C., more preferably 240° C. to 320° C., and still preferably 260° C. to 300° C.

From the same viewpoint, the period of time for which the maximum temperature is maintained is preferably 2 seconds to 10 seconds, more preferably 5 seconds to 5 minutes, and still more preferably 10 seconds to 3 minutes.

In addition, from the viewpoint of suppressing cracks formed in the anodic oxidation film due to a difference in coefficient of thermal expansion between the bonding target and the anodic oxidation film of the structure, a method of performing a heat treatment at a desired given temperature before the maximum temperature for preferably 5 seconds to 10 minutes, more preferably 10 seconds to 5 minutes, and still more preferably 20 seconds to 3 minutes can also be used. The desired given temperature is preferably 80° C. to 200° C., more preferably 100° C. to 180° C., and still more preferably 120° C. to 160° C.

In addition, from the viewpoint of performing reliable mounting, the temperature during the mounting by wire bonding is preferably 80° C. to 300° C., more preferably 90° C. to 250° C., and still more preferably 100° C. to 200° C. The heating time is preferably 2 seconds to 10 minutes, more preferably 5 seconds to 5 minutes, and still more preferably 10 seconds to 3 minutes.

[Coaxial Structure]

Figure 36:
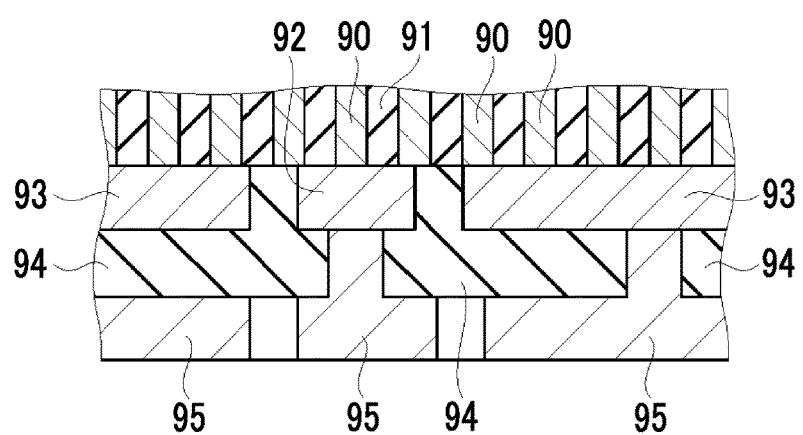
FIG. 36 is a schematic cross-sectional view showing a coaxial structure.
Figure 37:
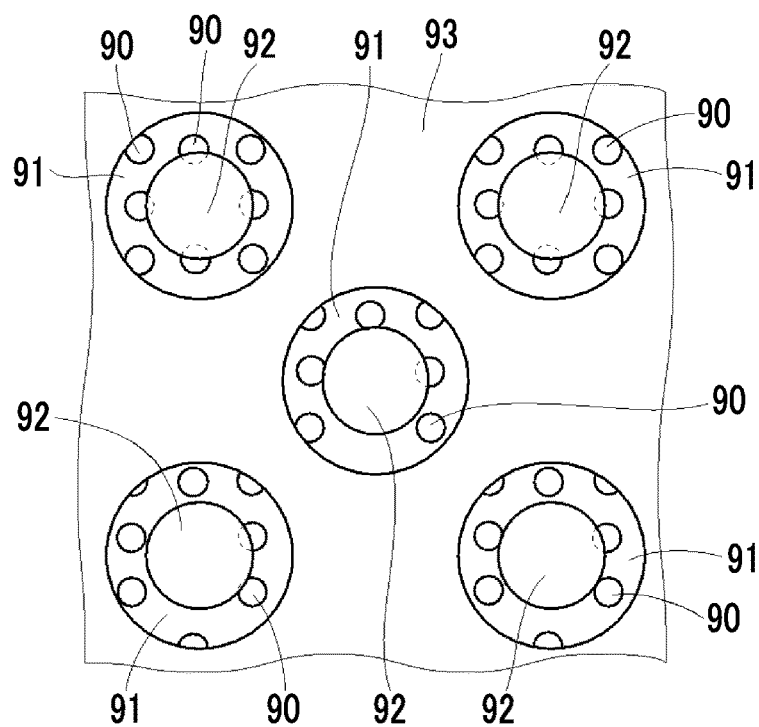
FIG. 37 is a schematic plan view showing the coaxial structure.

In addition, for example, as shown in FIGS. 36 and 37, a plurality of linear conductors 90 can also be disposed, in which the above-described wiring lines are connected to a ground wiring line 93 at predetermined intervals in the vicinity of the plurality of linear conductors 90 through which a signal current flows. This structure has the same structure as a coaxial line, and thus can exhibit a shielding effect. In addition, the plurality of linear conductors 90 connected to the ground wiring line 93 are disposed between the plurality of linear conductors 90 that are disposed adjacent to each other and through which different signal currents flow. Therefore, electrical coupling (capacitive coupling) occurring between the plurality of linear conductors 90 that are disposed adjacent to each other and through which different signal currents flow can be reduced, and the plurality of linear conductors 90 through which a signal current flows can be prevented from becoming a noise source. In FIG. 36, the plurality of linear conductors 90 through which a signal current flows are formed on an insulating substrate 91, are electrically insulated from each other, and are electrically connected to a signal wiring line 92. Wiring layers 95 that are electrically insulated from each other by an insulating layer 94 are electrically connected to the signal wiring line 92 and the ground wiring line 93.

Figure 38:
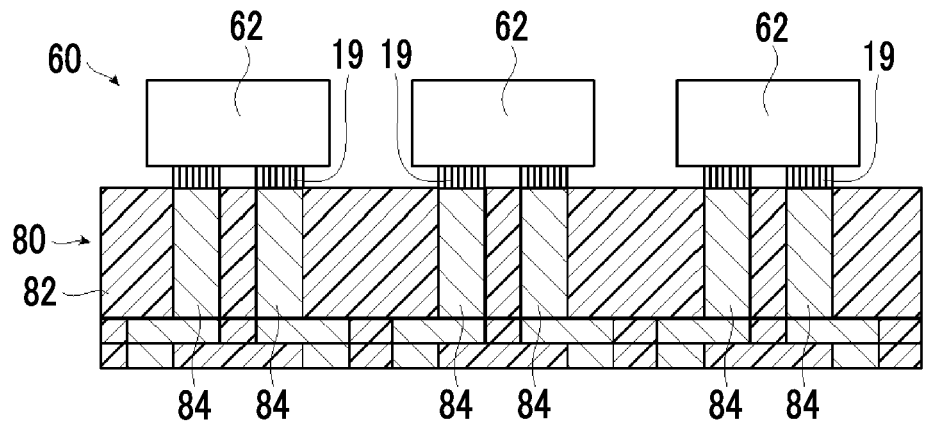
FIG. 38 is a schematic cross-sectional view showing a second example of the semiconductor package.

In addition, FIG. 38 is a schematic cross-sectional view showing a second example of the semiconductor package.

As shown in FIG. 38, the structure can also be used for electrical connection between the semiconductor package 60 and a printed wiring board 80. In the printed wiring board 80, the structure 18 is manufactured in the semiconductor package 60. In the printed wiring board 80, for example, a wiring layer 84 is provided on an insulating substrate 82 formed of a resin. The wiring layer 84 is electrically connected to the conductive path 16 of the conductive member 19.

In addition, the structure according to the embodiment of the present invention can also be used for connection (PoP: Package on Package) between two or more semiconductor packages. In this case, examples of an aspect of the structure include an aspect where two semiconductor packages disposed on upper and lower surface sides are connected through a predetermined wiring line.

In addition, the structure can also be used as a multi-chip package that is packaged by an aspect where two or more semiconductor elements are stacked on a substrate or an aspect where two or more semiconductor elements are horizontally disposed. In this case, examples of the aspect include an aspect where two or more semiconductor elements are stacked and connected through a predetermined wiring line.

[Electronic Device]

The electronic device is not limited to the one-to-plurality configuration in which a plurality of semiconductor elements are bonded to one semiconductor element but the embodiment is not limited thereto. The stacked device may have a plurality-to-plurality configuration in which a plurality of semiconductor elements are bonded to a plurality of semiconductor elements.

Figure 39:
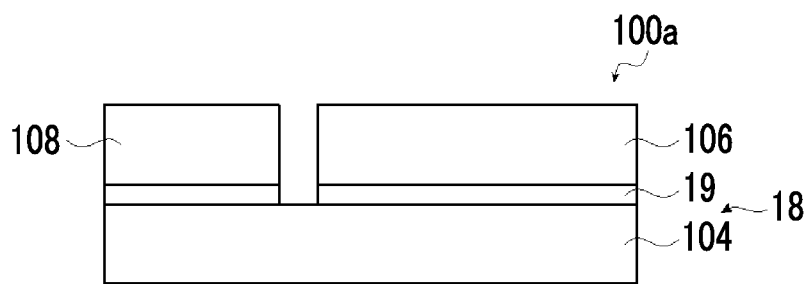
FIG. 39 is a schematic diagram showing a first example of an electronic device including the structure according to the embodiment of the present invention.
Figure 40:
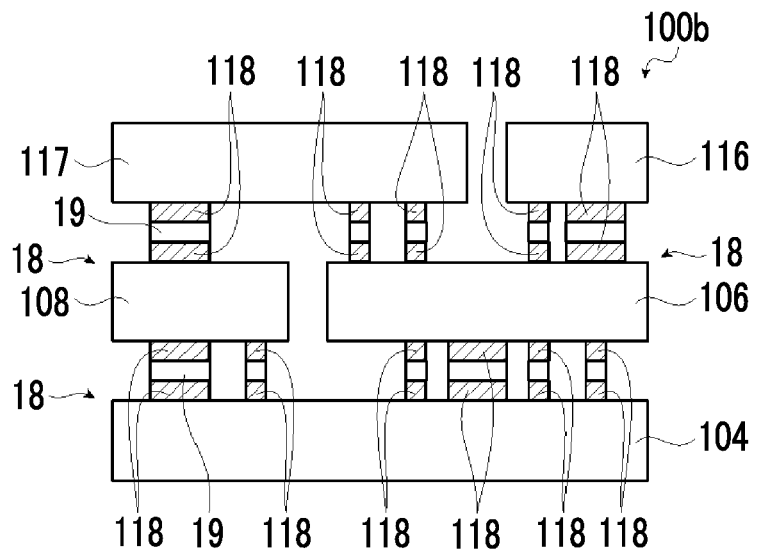
FIG. 40 is a schematic diagram showing a second example of the electronic device including the structure according to the embodiment of the present invention.
Figure 41:
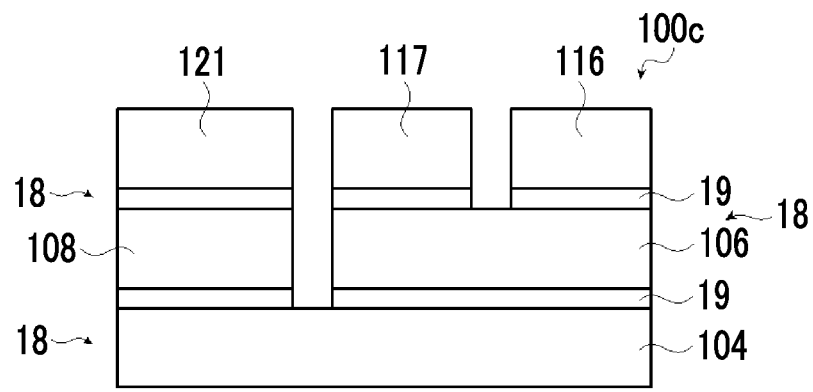
FIG. 41 is a schematic diagram showing a third example of the electronic device including the structure according to the embodiment of the present invention.
Figure 42:
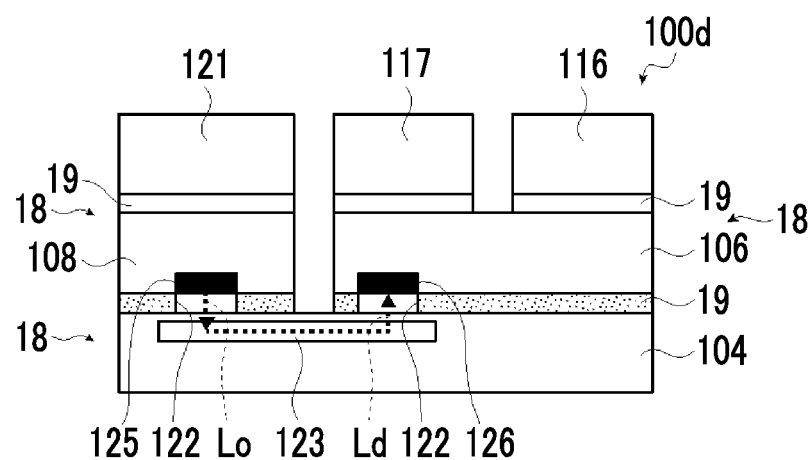
FIG. 42 is a schematic diagram showing a fourth example of the electronic device including the structure according to the embodiment of the present invention.

FIG. 39 is a schematic diagram showing a first example of an electronic device including the structure according to the embodiment of the present invention. FIG. 40 is a schematic diagram showing a second example of the electronic device including the structure according to the embodiment of the present invention. FIG. 41 is a schematic diagram showing a third example of the electronic device including the structure according to the embodiment of the present invention. FIG. 42 is a schematic diagram showing a fourth example of the electronic device including the structure according to the embodiment of the present invention.

In addition, as the plurality-to-plurality configuration, for example, as shown in FIG. 39, an electronic device 100*a* can be used, in which the structure 18 is formed on one semiconductor element 104 and a semiconductor element 106 and a semiconductor element 108 are bonded using the conductive member 19 of the structure 18 and are electrically connected. The semiconductor element 104 may have an interposer function.

In addition, for example, a plurality of devices such as a logic chip including a logical circuit and a memory chip can also be stacked on a device having an interposer function. In addition, in this case, even the electrode sizes of the devices are different from each other, the devices can be bonded.

In an electronic device 100*b* shown in FIG. 40, the sizes of electrodes 118 are not the same, and electrodes 118 having different sizes are mixed. However, the structure 18 is formed on one semiconductor element 104 and the semiconductor element 106 and the semiconductor element 108 are bonded using the conductive member 19 of the structure 18 and are electrically connected. Further, the semiconductor element 106 and the semiconductor element 108 are formed as the structure 18, and a semiconductor element 116 is bonded and electrically connected to the semiconductor element 106 using the conductive member 19 of the structure 18. Further, a semiconductor element 117 is bonded and electrically connected to the semiconductor element 106 and the semiconductor element 108 using the conductive member 19 of the structure 18.

In addition, as in an electronic device 100c shown in FIG. 41, the structure 18 is formed on one semiconductor element 104 and the semiconductor element 106 and the semiconductor element 108 are bonded using the conductive member 19 of the structure 18 and are electrically connected. Further, a configuration can also be adopted, in which the semiconductor element 106 and the semiconductor element 108 are formed as the structure 18, the semiconductor element 116 and the semiconductor element 117 are bonded to the semiconductor element 106 using the conductive member 19 of the structure 18, and a semiconductor element 121 is bonded and electrically connected to the semiconductor element 108 using the conductive member 19 of the structure 18.

In the above-described configuration, by stacking a light-emitting element such as a vertical cavity surface emitting laser (VCSEL) and a light-receiving element such as a complementary metal oxide semiconductor (CMOS) image sensor on a device surface including an optical waveguide, the embodiment is also applicable to silicon photonics assuming a high frequency.

For example, as in an electronic device 100d shown in FIG. 42, the structure 18 is formed on one semiconductor element 104 and the semiconductor element 106 and the semiconductor element 108 are bonded using the conductive member 19 of the structure 18 and are electrically connected. Further, the semiconductor element 106 and the semiconductor element 108 are formed as the structure 18, the semiconductor element 116 and the semiconductor element 117 are bonded to the semiconductor element 106 using the conductive member 19 of the structure 18, and the semiconductor element 121 is bonded and electrically connected to the semiconductor element 108 using the conductive member 19 of the structure 18.

An optical waveguide 123 is provided in the semiconductor element 104. A light-emitting element 125 is provided in the semiconductor element 108, and a light-receiving element 126 is provided in the semiconductor element 106. Light Lo output from the light-emitting element 125 of the semiconductor element 108 passes through the optical waveguide 123 of the semiconductor element 104 and is emitted to the light-receiving element 126 of the semiconductor element 106 as emitted light Ld. As a result, the embodiment is applicable to the above-described silicon photonics.

In the structure 18 of the semiconductor element 104, the conductive member 19 is formed to avoid a region 122 corresponding to an optical path of the light Lo and the emitted light Ld.

Basically, the present invention is configured as described above. Hereinabove, the method of manufacturing the structure according to the embodiment of the present invention has been described in detail. However, the present invention is not limited to the above-described examples, and various improvements or modifications can be made within a range not departing from the scope of the present invention.

EXPLANATION OF REFERENCES

10: insulating support
10a, 12a, 14a: surface
10c: element region
11: resist layer
11a: surface
12: conductive layer
12c: edge surface
13: valve metal layer
14: anodic oxidation film
15: through-hole
16: conductive path
16a: protrusion portion
17: resin layer
18: structure
19: conductive member
30, 32: semiconductor element
33: semiconductor layer
33a, 34a, 36a, 46a: surface
34: re-distribution layer
36: passivation layer
37: wiring line
38: pad
39: bonded body
40: stacked device
42, 44, 46, 62: semiconductor element
44b: back surface
45: interposer
47: sensor chip
48: lens
50: first semiconductor wafer
50a: surface
52: second semiconductor wafer
60: semiconductor package
64: mold resin
70: wiring board
72: insulating substrate
74: wiring layer
75: solder ball
80: printed wiring board
82: insulating substrate
84: wiring layer
90: linear conductor
91: insulating substrate
92: signal wiring line
93: ground wiring line
94: insulating layer
95: wiring layer
100a, 100b, 100c, 100d: electronic device
104, 106, 108, 116, 117, 121: semiconductor element
118: electrode
122: region
123: optical waveguide
125: light-emitting element
126: light-receiving element
Ds: stacking direction
Dt: thickness direction
Ld: emitted light
Lo: light
h: thickness
p: distance between centers
x: direction

What is claimed is:

1. A method of manufacturing a structure comprising:
a conductive layer forming step of forming a conductive layer having conductivity on a part of a surface of an insulating support including at least one surface;
a valve metal layer forming step of forming a valve metal layer that covers at least a part of the conductive layer;

an anodic oxidation film forming step of forming an anodic oxidation film by performing an anodization treatment on the valve metal layer in a region on the conductive layer using the conductive layer as an electrode;

a micropore forming step of forming a plurality of micropores that extend in a thickness direction on the anodic oxidation film; and a filling step of filling the micropores with a conductive material, wherein a valve metal layer removing step of removing the valve metal layer having undergone the anodic oxidation film forming step is performed between the anodic oxidation film forming step and the filling step.

2. The method of manufacturing a structure according to claim 1, wherein the valve metal layer removing step is performed between the anodic oxidation film forming step and the micropore forming step or between the micropore forming step and the filling step.

3. The method of manufacturing a structure according to claim 1, wherein the micropore forming step includes a step of exposing the conductive layer by forming the plurality of micropores through the anodic oxidation film in the thickness direction.

4. The method of manufacturing a, structure according to claim 1, wherein in the valve metal layer forming step, the valve metal layer is formed at a temperature of the insulating support of 60° C. or lower.

5. The method of manufacturing a structure according to claim 1, further comprising:

a protrusion step of causing a plurality of conductive paths formed of the filled conductive material to protrude from the anodic oxidation film.

6. The method of manufacturing a structure according to claim 5, wherein each of the plurality of conductive paths that protrude in the protrusion step has the same height as a protrusion portion that protrudes from the anodic oxidation film.

7. The method of manufacturing a structure according to claim 1, wherein the conductive layer is formed of the same material as the conductive material.

8. The method of manufacturing a structure according to claim 1, wherein the valve metal is aluminum.

9. The method of manufacturing a structure according to claim 1, wherein the surface of the insulating support includes an element region, and in the conductive layer forming step, the conductive layer is formed on the element region of the surface of the insulating support.

10. The method of manufacturing a structure according to claim 2, wherein the micropore forming step includes a step of exposing the conductive layer by forming the plurality of micropores through the anodic oxidation film in the thickness direction.

11. The method of manufacturing a structure according to claim 2, wherein in the valve metal layer forming step, the valve metal layer is formed at a temperature of the insulating support of 60° C. or lower.

12. The method of manufacturing a structure according to claim 2, further comprising:

a protrusion step of causing a plurality of conductive paths formed of the filled conductive material to protrude from the anodic oxidation film.

13. The method of manufacturing a structure according to claim 12, wherein each of the plurality of conductive paths that protrude in the protrusion step has the same height as a protrusion portion that protrudes from the anodic oxidation film.

14. The method of manufacturing a structure according to claim 2, wherein the conductive layer is formed of the same material as the conductive material.

15. The method of manufacturing a structure according to claim 2, wherein the valve metal is aluminum.

16. The method of manufacturing a structure according to claim 2, wherein the surface of the insulating support includes an element region, and in the conductive layer forming step, the conductive layer is formed on the element region of the surface of the insulating support.

17. The method of manufacturing a structure according to claim 3, wherein in the valve metal layer forming step, the valve metal layer is formed at a temperature of the insulating support of 60° C. or lower.

18. The method of manufacturing a structure according to claim 3, further comprising:

a protrusion step of causing a plurality of conductive paths formed of the filled conductive material to protrude from the anodic oxidation film.

19. The method of manufacturing a structure according to claim 18, wherein each of the plurality of conductive paths that protrude in the protrusion step has the same height as a protrusion portion that protrudes from the anodic oxidation film.

20. The method of manufacturing a structure according to claim 3, wherein the conductive layer is formed of the same material as the conductive material.

* * * * *